(12) United States Patent
Taylor et al.

(10) Patent No.: US 9,343,748 B2
(45) Date of Patent: May 17, 2016

(54) BULK METALLIC GLASS NANOWIRES FOR USE IN ENERGY CONVERSION AND STORAGE DEVICES

(75) Inventors: Andre D. Taylor, New Haven, CT (US); Jan Schroers, Hamden, CT (US)

(73) Assignee: Yale University, New Haven, CT (US)

(*) Notice: Subject to any disclaimer, the term of this patent is extended or adjusted under 35 U.S.C. 154(b) by 189 days.

(21) Appl. No.: 13/702,288

(22) PCT Filed: Aug. 8, 2011

(86) PCT No.: PCT/US2011/046947
§ 371 (c)(1),
(2), (4) Date: Feb. 27, 2013

(87) PCT Pub. No.: WO2011/156825
PCT Pub. Date: Dec. 15, 2011

(65) Prior Publication Data
US 2013/0150230 A1    Jun. 13, 2013

Related U.S. Application Data

(60) Provisional application No. 61/352,574, filed on Jun. 8, 2010, provisional application No. 61/422,006, filed on Dec. 10, 2010.

(51) Int. Cl.
*H01M 4/92* (2006.01)
*C22C 5/04* (2006.01)
(Continued)

(52) U.S. Cl.
CPC .............. *H01M 4/923* (2013.01); *B82Y 30/00* (2013.01); *B82Y 40/00* (2013.01);
(Continued)

(58) Field of Classification Search
CPC .............. C22C 5/04; C22C 45/003; B01J 2219/00754; B82Y 30/00; B82Y 40/00; H01M 4/921; H01M 4/923

USPC ............ 148/403, 561; 420/468; 429/524; 502/339; 977/900, 762
See application file for complete search history.

(56) References Cited

U.S. PATENT DOCUMENTS 3,856,513 A * 12/1974 Chen et al. ............. 148/403
4,339,270 A * 7/1982 Hashimoto et al. ........ 148/403
(Continued)

FOREIGN PATENT DOCUMENTS

WO    WO 2010/029550    3/2010
WO    WO 2011/156825    8/2011

OTHER PUBLICATIONS

"Dr. Carmo presents at Hilton Head 2010: Bulk Metallic Glass Nanowires for Use in Direct Alcohol Fuel Cells"; no date available; 2 pages.*

(Continued)

*Primary Examiner* — Helene Klemanski
(74) *Attorney, Agent, or Firm* — McCarter & English, LLP

(57) ABSTRACT

A class of materials has advantageous utility in electrocatalytic applications, e.g., fuel cells. The materials circumvent conventional Pt-based anode poisoning and the agglomeration/dissolution of supported catalysts during long-term operation by exploiting the unique physical and chemical properties of bulk metallic glass to create nanowires for electrocatalytic applications, e.g., fuel cell and battery applications. These amorphous metals can achieve unusual geometries and shapes along multiple length scales. The absence of crystallites, grain boundaries and dislocations in the amorphous structure of bulk metallic glasses results in a homogeneous and isotropic material down to the atomic scale, which displays very high strength, hardness, elastic strain limit and corrosion resistance. The melting temperatures of the disclosed bulk metallic glasses are much lower than the estimated melting temperatures based on interpolation of the alloy constituents making them attractive as highly malleable materials.

14 Claims, 14 Drawing Sheets

(51) Int. Cl.

| | |
|---|---|
| *C22C 45/00* | (2006.01) |
| *B82Y 30/00* | (2011.01) |
| *B82Y 40/00* | (2011.01) |
| *H01L 31/0224* | (2006.01) |
| *H01M 4/04* | (2006.01) |
| *H01M 4/88* | (2006.01) |
| *H01M 8/10* | (2016.01) |

(52) U.S. Cl.
CPC ............ *H01L 31/0224* (2013.01); *H01M 4/04* (2013.01); *H01M 4/88* (2013.01); *H01M 4/921* (2013.01); *B01J 2219/0075* (2013.01); *B01J 2219/00443* (2013.01); *B01J 2219/00533* (2013.01); *B01J 2219/00556* (2013.01); *B01J 2219/00558* (2013.01); *B01J 2219/00659* (2013.01); *B01J 2219/00693* (2013.01); *B01J 2219/00754* (2013.01); *H01M 8/1011* (2013.01); *H01M 8/1013* (2013.01); *H01M 2008/1095* (2013.01); *Y02E 60/50* (2013.01)

(56) References Cited

U.S. PATENT DOCUMENTS

| | | | | |
|---|---|---|---|---|
| 4,545,883 | A * | 10/1985 | Ovshinsky et al. | 204/192.15 |
| 4,560,454 | A * | 12/1985 | Harris et al. | 148/403 |
| 4,746,584 | A * | 5/1988 | Tenhover et al. | 148/403 |
| 4,770,949 | A * | 9/1988 | Hashimoto et al. | 148/403 |
| 5,429,725 | A * | 7/1995 | Thorpe et al. | 148/403 |
| 6,187,164 | B1 * | 2/2001 | Warren et al. | 205/81 |
| 7,582,172 | B2 * | 9/2009 | Schroers et al. | 148/403 |
| 8,641,839 | B2 * | 2/2014 | Schroers et al. | 148/561 |
| 8,828,155 | B2 * | 9/2014 | Johnson et al. | 420/468 |
| 2006/0251952 | A1 | 11/2006 | Chondroudis et al. | |
| 2008/0121534 | A1 | 5/2008 | White et al. | |
| 2008/0193781 | A1 * | 8/2008 | Sawyer et al. | 428/457 |

OTHER PUBLICATIONS

Hilton Head 2010 Final Program; Jun. 2010; 23 pages.*
Watanabe, et al., Electrocatalysis by Ad-Atoms Part III. Enhancement of the Oxidation of Carbon Monoxide on Platinum by Ruthenium Ad-Atoms; Electroanalytical Chemistry and Interfacial Electrochemistry, 60, pp. 275-283, 1975, no month available.
Kumar, et al., Nanomoulding With Amorphous Metals, Nature Letters, vol. 457, pp. 868-873, Feb. 2009.
Liu, et al., Nanoporous Pt—Co Alloy Nanowires: Fabrication, Characterization, and Electrocatalytic Properties, Nano Letters, vol. 9, No. 12, pp. 4352-4358, 2009, no month available.
Strasser, et al., Lattice-Strain Control of the Activity in Dealloyed Core-Shell Fuel Cell Catalysts, Nature Chemistry, vol. 2, pp. 454-460, Apr. 2010.
Carmo, et al., Bulk Metallic Glass Nanowires for Use in Direct Alcohol Fuel Cell, no date available.
Zhang et al., The Nanopore Electrode, Analytical Chemistry [online], Web Publication date; Sep. 14, 2004, vol. 76, No. 21, pp. 6229-6238, Retrieved from the Internet: Http://pubs.acs.org/doi/abs/10.1021/ac049588r.
Carmo et al., Bulk Metallic Glass Nanowire Architecture for Electrochemical Applications, ACS Nano [online] Web Publication Date: Mar. 3, 2011, vol. 5, No. 4, pp. 2979-2983, http://pubs.acs.org/doi/abs/10.1021/nn200033c.
PCT International Search Report and Written Opinion of International Patent Application No. PCT/US2011/046947 dated Jan. 5, 2012.

* cited by examiner

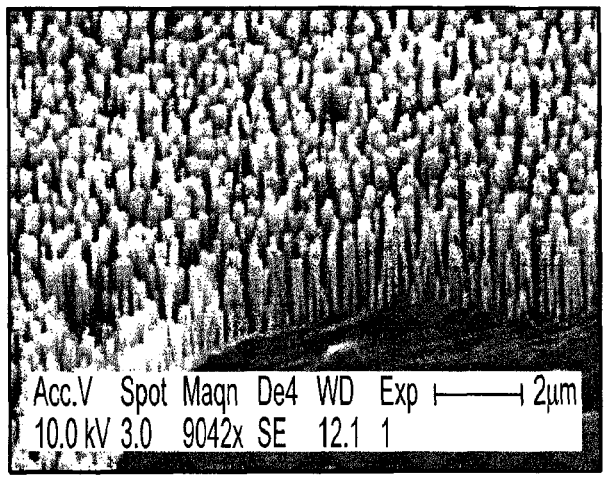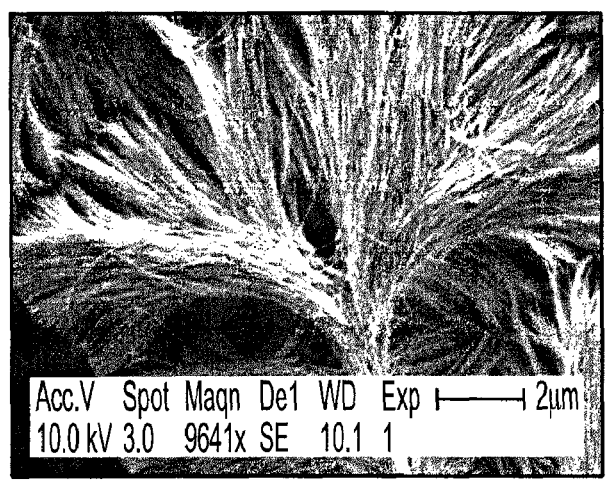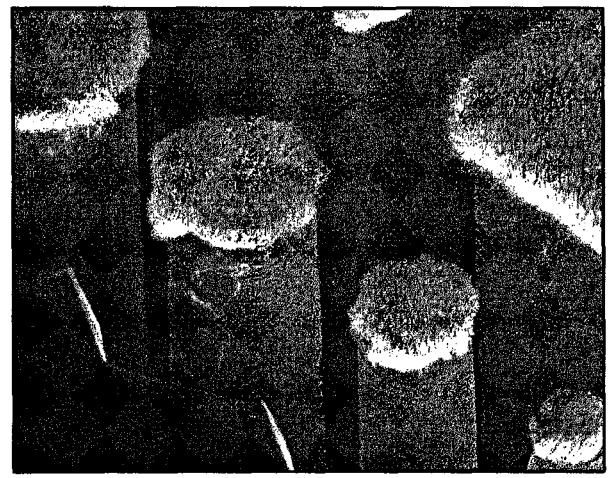
FIG. 3A

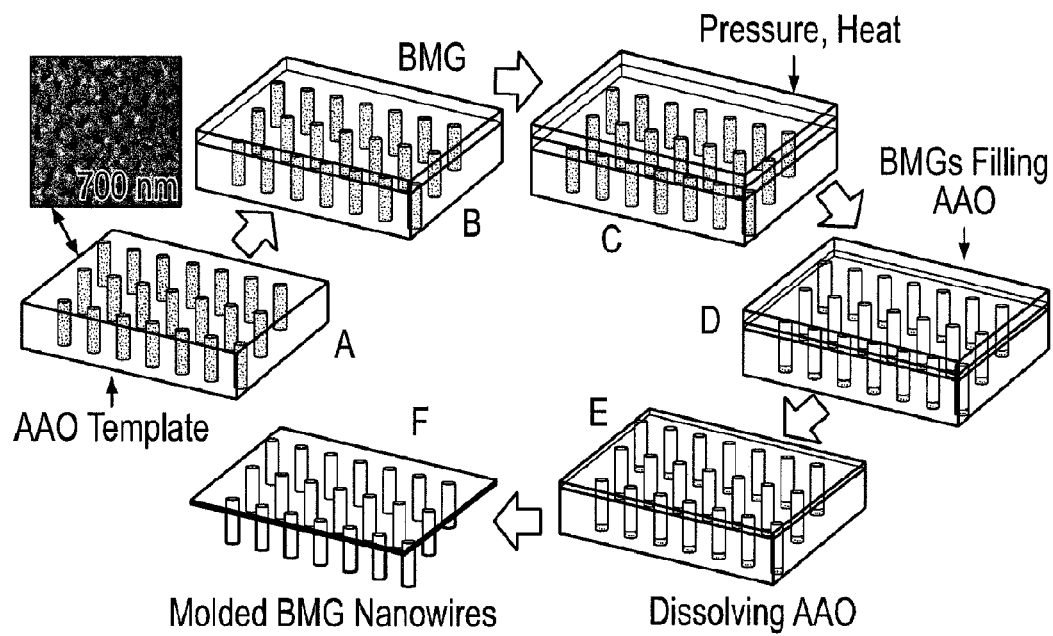
FIG. 11
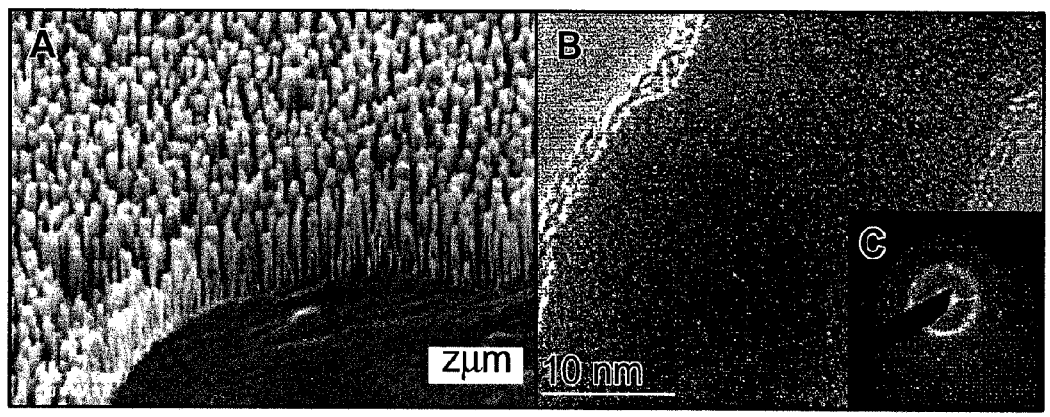
FIG. 12 A-C

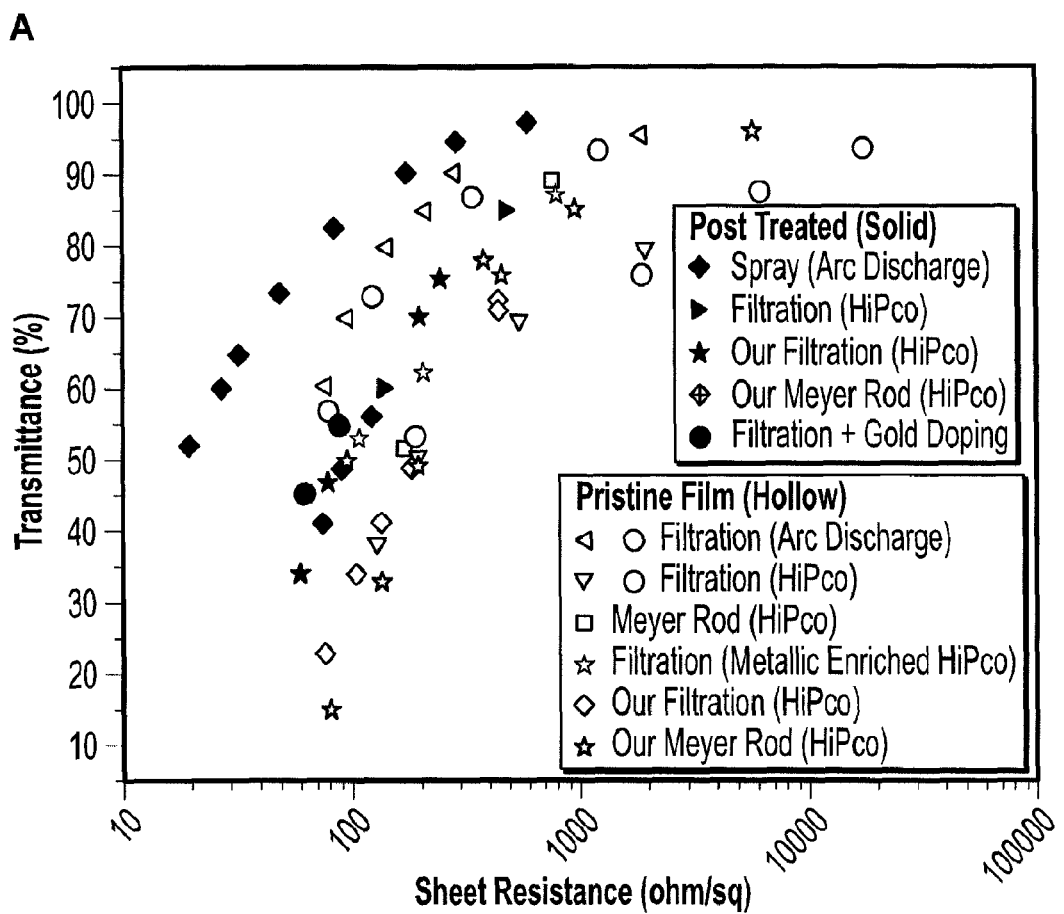
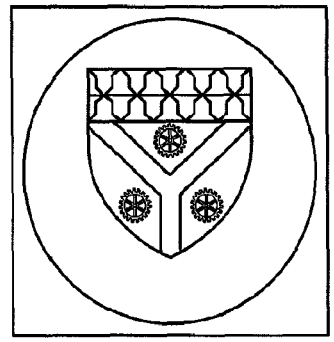
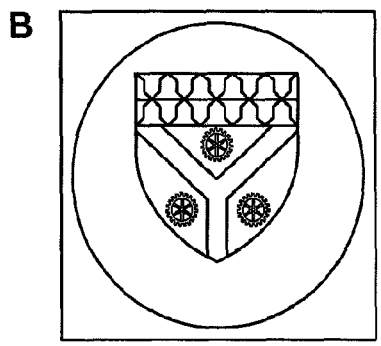
FIG. 13

BULK METALLIC GLASS NANOWIRES FOR USE IN ENERGY CONVERSION AND STORAGE DEVICES

BACKGROUND

1. Technical Field

Fuel cells have been championed as viable alternatives over existing battery technology for portable electronic devices; however, a key issue for widespread adoption and success of fuel cell technology involves addressing the meager performance of these devices due to poor efficiency and durability of the catalysts. The present disclosure is generally directed to bulk metallic glass materials for energy conversion and storage applications. More particularly, the present disclosure is directed to a new class of materials that can circumvent Pt-based anode poisoning and the agglomeration/dissolution of supported catalysts during long-term fuel cell operation. An exemplary implementation of the present disclosure involves use of $Pt_{58}Cu_{15}Ni_5P_{22}$ bulk metallic glass to create a new class of high performance nanowire catalysts for use in fuel cell applications.

2. Background Art

Amorphous alloys were developed approximately fifty years ago following reports concerning the formation of Au-Si metallic glass [1]. Researchers developed rapid quenching techniques for chilling metallic liquids at cooling rates of 105-106° K/s. However, these high cooling rates limited the potential geometries of these alloys to thin sheets/lines and stymied the range of potential applications [2]. Recently, the development of several multi-component alloys capable of solidifying into glass at relatively low cooling rates (1~102° K/s)—materials that vitrify without crystallization—has permitted the production of large-scale bulk metallic glass (BMG) samples on the order of 30 mm [3]. These BMGs represent a new class of engineering materials with an unusual combination of strength, elasticity, hardness, corrosion resistance and processability [4-8]. The random atomic structure in BMGs is devoid of dislocations and associated slip planes. These systems can result in elasticities of 2% (Zr-based BMG formers [6]) and yield strengths of up to 5 GPa (Co-based BMG formers [9]). During yielding, however, BMGs can suffer from macroscopically brittle failure at ambient temperatures [10]; however, when samples with small dimensions are characterized, significant global plasticity is observed [11-13].

A wide range of BMG-forming alloys have been developed, including Zr-[14-16], Fe-[17, 18], Cu-[19], Ni-[20], Ti-[21], Mg-[22], Pd-[23], Au-[24] and Pt-based compositions [25]. As discussed by Wang et al. [2] and Schroers [26], applications for these materials can range from thermoelectric devices to biocompatible implants and have already impacted fields ranging from sports (i.e., tennis rackets, golf clubs etc.) to Micro/Nano Electromechanical systems (MEMs/NEMs) devices.

One of the challenges with BMGs is that the current approach towards developing these materials to exhibit specific properties is carried out by synthesizing and characterizing each alloy composition individually. The common strategy is a trial and error approach that can result in hundreds of time-consuming experiments [24, 25]. Such an approach is highly inefficient towards rapid identification of bulk metallic glass forming compositions, limiting advancements in this field. A combinatorial approach could provide an elegant solution to the task of mapping systems that could form new bulk metallic glass alloys with desirable properties. Successful combinatorial techniques have previously been developed in the pharmaceutical industry [27] and are now being considered as a viable approach for mapping alloys across compositional phase diagrams [28, 29]. For example, Sakurai et al. used a combinatorial arc plasma deposition (CAPD) to search for Ru-based thin film metallic glass by making libraries. Each library consisted of 1089 CAPD samples deposited on a substrate [30].

With specific reference to fuel cell technology, a fuel cell electrode has three primary functions: (i) allowing access to reacting gases, (ii) providing active electrocatalytic sites, and (iii) allowing transport of electrons as well as ions. Electrical power is generated by oxidizing the fuel electrochemically, e.g., by digesting carbon-based fuels with the help of an internal catalyst. However, poisoning and/or deposition on the anode can significantly interfere with the operation/efficiency of fuel cell systems. For example, sulfur is a potent poison for nickel electrocatalysts present in many current anodes. Similarly, conventional anode technology—which generally involves anodes fabricated from porous carbon coated with platinum—is highly susceptible to impurities in the hydrogen fuel which, if present, easily bind with the platinum, "poisoning" the electrode and decreasing fuel cell performance Carbon deposition, which reduces the activity of the anode, can occur if the steam-to-carbon ratio of the fuel gas is too low. Nickel effectively functions as a catalyst for carbon deposition (coking), thereby blocking the active sites of the anode and, in the worst case, destroying its structure. Technologies/techniques are needed that ensure durability and efficiency of fuel cell operation, despite the potential for poisoning and/or deposition phenomena interfering with anode functionality.

The role of surface chemistry in catalytic development is significant. The surface chemistry of a material in the praxis of a metal/electrolyte interface can be described by either heterogeneous or electrochemical reactions where one can term the activation surface a catalyst. The activity of the catalyst can be due to structural or chemical modifications of the electrode surface and additions to the electrolyte. Structural effects can be caused by variations in the electronic state and by variation in the geometric nature (i.e. crystal planes, clusters, alloys, surface defects) [46]. To correlate the electrocatalytic ability with a physiochemical property of a material, plots can be made of electrochemical activity (either current density at constant potential, or potential at constant current density) versus the physiochemical property. Balandin first proposed these as volcano plots [47], if the resulting plot is a bell curve (see FIG. 4—adapted from [48]).

Heterogeneous catalysis is relevant to the design and operation of direct alcohol fuel cells. The optimum heterogeneous catalyst will provide the correct reaction site geometry, along with the proper electronic environment, to facilitate the reaction of interest. An example of this can be found from catalyst development in direct alcohol fuel cells where a major challenge is the search for efficient electrocatalysts that would remedy the Pt-based anode poisoning by a carbonaceous intermediate (most likely CO) during alcohol oxidation. Direct alcohol fuel cells are of particular interest because of the high power density of liquid fuels (e.g. methanol, ethanol). The best catalysts for methanol oxidation are based on Pt—Ru systems. However, the high cost of Ru has led to research aiming to identify other less expensive metals, M, that exhibit enhancement of Pt or Pt—Ru catalytic activity. A guide to the design of efficient Pt-M methanol oxidation binary systems is provided in a review by Ishikawa et al., where the theoretical predictions for the effect of the second metal is provided by three key reaction steps (methanol dissociative chemisorption, CO poison adsorption, and CO removal via its oxidation by adsorbed OH) [49]. The effects of these Pt-M systems can be grouped into two main categories:
1. Ligand effect—modification of the Pt electronic properties by the second metal [50].
2. Synergistic effect—bi-functional mechanism whereby the second metal disrupts the continuity of the Pt lattice and provides sites for OH adsorption [51-53].

More recently, the electronic effect has been studied using the density functional theory to estimate the direction and extent of the d-band energy center, ed, shifts when metals of different Wigner-Seitz radii and electronegativity are found together [54-56]. Of note, the addition of Cu, Fe, Co, and Ni to Pt results in a Pt $e_d$ down-shift, which in turn is both theoretically predicted and experimentally found to lead to decreased CO adsorption [57-61].

Corrosion challenges are substantial with conventional fuel cell catalysts. The surface chemistry activity is also related to the structural stability and corrosion of the surface. For instance, in direct alcohol fuel cells, electrocatalyst durability has been recently recognized as one of the most important issues that must be addressed prior to direct alcohol fuel cell commercialization [62, 63]. Presently, the most widely used catalyst system is platinum in the form of small nanoparticles (2-5 nm) supported on amorphous carbon-particle aggregates (Pt/C). The poor durability of the Pt/C catalyst is evident by a fast and significant loss of platinum electrochemical surface area (ECSA) during the time of fuel cell operation [62-64]. The mechanisms for the loss of platinum ECSA can be summarized as follows[62, 63]:
1. Loss of Pt nanoparticles from the electrical contact due to corrosion of the carbon support.
2. Pt dissolution and redeposition (migration of the soluble Pt+ species within the polymer electrolyte and the eventual chemical reduction by hydrogen crossover from the anode through the proton exchange membrane.
3. Ostwald ripening (Pt nanoparticle aggregation driven by surface energy minimization.)

For these reasons, there has been considerable recent interest in the development of nanowire fuel cell catalysts [65-67]. Previous nanometallic synthesis efforts have focused on bottom up assembly through the reduction of salt precursors or electrochemical deposition processes to create the following: Pt and Pd nanotubes [68], Au-Ag nanoporous nanotubes [69], NiCu [70], PtCo nanowires [71], $Pt_3Ni(111)$ single crystals [72], and Pd-Pt bimetallic nanodendrites [73]. Many of these strategies involve complex synthesis methods due to the difficulty in forming metallic alloys into the nanometer-length scales necessary for maintaining a high dispersion (noble metal utilization). Of further note, Chen et al. reported an enhanced durability for pure platinum nanotubes (PtNTs) and suggested that the activity of the PtNTs could be further improved by employing platinum alloy nanotubes [68].

Based upon these initial challenges, there is a clear need for a new type of catalyst material that does not suffer from durability issues and that displays the high electrochemical activity consistent with a multi-component catalyst system. Bulk metallic glasses (BMGs) are of particular interest for these kinds of surface chemistry studies because the surface and structure of these alloys can be patterned down to the same scale as conventional supported catalysts [26]. The absence of crystallites, grain boundaries, and dislocations in the amorphous structure of bulk metallic glass results in a homogeneous and isotropic material down to the atomic scale, which displays very high strength, hardness, elastic strain limit and corrosion resistance. BMGs represent a positive step in this direction as these amorphous metals can be formed into nanowires (FIG. 3d) that circumvent the very complex synthesis, low throughput, low reproducibility, and high cost typically associated with nanowire fabrication [74-77].

These and other objectives are satisfied according to the systems and methods of the present disclosure.

SUMMARY

According to the present disclosure, a two step process for complex multi-component alloy development and characterization is provided. The two step process involves synthesis of a combinatorial (multi-component) library and high throughput characterization methods with respect to materials associated with such library. The characterization methods are primarily focused on identifying new material compositions that form effective metallic alloys for energy conversion and storage applications. Through the foregoing two step process, a multi target co-sputtering system may be developed with targets arranged to facilitate specific sectors of phase diagrams to be created for specific applications (FIG. 1). Of note, phase diagrams of up to six (6) components have been considered for some advanced materials [31].

In addition, the present disclosure provides advantageous systems and methods utilizing a new class of materials that circumvent Pt-based anode poisoning and the agglomeration/dissolution of supported catalysts during long-term operation. In an exemplary implementation of the disclosed class of materials, the present disclosure provides a CMOS compatible approach using $Pt_{58}Cu_{15}N_5P_{22}$ bulk metallic glass to create high performance nanowire catalysts for fuel cells. Additional bulk metallic glass materials that provide the requisite electrocatalysis functionality may be utilized according to the present disclosure to generate high performance nanowires, e.g., in conjunction with a Pt/C catalyst. Thus, the present disclosure exploits the unique physical and chemical properties of bulk metallic glass to create nanowires that exhibit substantial aspect ratios (e.g., based on nanofiber filaments of 10-15 nm diameter) to deliver advantageous electrocatalytic functionality. These amorphous metals can achieve unusual geometries and shapes along multiple length scales (see FIG. 3A). BMGs are a subset of glass forming alloys that can be easily vitrified and formed into relatively large amorphous sections. The absence of crystallites, grain boundaries and dislocations in the amorphous structure of bulk metallic glass results in a homogeneous and isotropic material down to the atomic scale, which displays very high strength, hardness, elastic strain limit and corrosion resistance. The melting temperatures of these BMGs are much lower than the estimated melting temperatures based on interpolation of the alloy constituents making them attractive as highly malleable materials.

The present disclosure thus may be used to provide an advantageous top down approach, e.g., using nanoimprint lithography (FIG. 2), to create BMG nanowires with properties, compositions, and geometry suitable for high performance energy conversion and storage devices. Indeed, according to the present disclosure, Pt-BMG ($Pt_{58}Cu_{15}Ni_5P_{22}$) nanowires have been shown to maintain high performance stability under fuel cell operating conditions in comparison to conventional E-Tek (Pt/C) catalysts. The foregoing advantageous results may be extrapolated to other metal systems (e.g., bimetallic combinations) that exhibit significant electrochemical activity (see Volcano Plot of FIG. 4), and synthesizing such materials into amorphous metal alloys. Indeed, positive results have been demonstrated with palladium-based metal systems. The two step process described herein may be employed to effectively demonstrate the efficacy of such metal systems for BMG-based nanofiber fabrication, e.g., using microfabricated electrode arrays to develop sputter composition libraries that are optimized for a desired electrochemical activity (e.g., ethanol oxidation).

The systems and methods of the present disclosure have wide ranging application. For example, direct alcohol fuel cells (DAFCs) are of particular interest because of the high power density of liquid fuels (e.g., methanol, ethanol, etc.). Ethanol, for example, is non-toxic and a rich source of hydrogen. DAFCs normally use Pt/C catalysts that typically suffer from poor performance and durability arising from slow reaction kinetics, loss of electrochemical active surface area, and corrosion of the carbon support. Amorphous metal compositions may be employed that readily alloy with lithium (i.e., Li-BMGs), but do not suffer from cycling degradation typically associated with bulk materials, for use in DAFC systems. The use of BMG materials as catalysts for fuel cells opens up the possibility for a completely new class of materials to be used for electrochemical applications. BMG alloys can be low cost synthesized to promote high electrocatalytic activity, high Pt dispersion, and high durability. Examples of these improvements are shown by CO oxidation (tolerance), chronoamperometry accelerated durability tests, and alcohol (methanol and ethanol) oxidation.

Among the uses of the BMG materials of the present disclosure are electrocatalysts (anode and cathode) for polymer exchange membrane fuel cell catalyst (PEMFC), direct methanol fuel cells (DMFC), direct ethanol fuel cells (DEFC), alkaline fuel cells (AFC), phosphoric acid fuel cells (PAFC), solid oxide fuel cells (SOFC), mini/micro fuel cells, electrodes for $H_2/O_2$ electrolysis, electrodes for $H_2/Cl$ electrolysis, heterogeneous catalysis-like hydrocarbons production, NOx trap reactions and hydrogen gas extraction. It is noted that ethanol fuel cells, for example, can potentially be used to power implantable medical devices, such as micro-insulin pumps for controlled drug release, cerebrospinal shunt pump, pacemakers and for biotelemetry.

Thus, the systems and methods of the present disclosure have utility across a host of electrocatalytic fields, e.g., addressing various needs and opportunities in the energy landscapes for facilitating reliable and durable catalytic and electrochemical reactions.

Additional features, functions and benefits of the disclosed systems and methods will be apparent from the detailed description which follows, particularly when read in conjunction with the appended figures.

BRIEF DESCRIPTION OF THE FIGURES

To assist those of ordinary skill in the art in making and using the disclosed systems and methods, reference is made to the appended figures, wherein:

FIG. 3A is a series of images of bulk metallic nanowires according to the present disclosure.

FIG. 11 provides a schematic showing an exemplary method for synthesis of BMG nanowires according to the present disclosure. Top image schematic synthesis of BMG nanowire. Steps listed as A-F for each processing step.

FIGS. 12A-C provides images of exemplary BMG nanowires fabricated according to the method of FIG. 11. A) Lower images Scanning Electron Microscopy (SEM), B) Transmission Electron Microscopy (TEM), and C) Selected Area Electron Diffraction images for BMG nanowires.

FIG. 13 provides a plot comparing electro-optical performance of SWNT films and a related image of a film. (a) Comparison of electrooptical performance of HiPco SWNT films according to the present disclosure before and after acid and/or gold treatment with other SWNT films reported in the literature. SWNT films; and (b) a 47 mm diameter SWNT film on PET transferred from filter. The transmittance of this film is 71% at 550 nm. The sheet resistance of this film is 421 Ohm/sq.

DESCRIPTION OF EXEMPLARY EMBODIMENT(S)

Nature often utilizes topography to control a vast range of properties through controlled hierarchy of the surface structures. Some examples include gecko feet, sharkskin, and lotus flowers where the superposition of patterns of at least two length scales dramatically effect adhesion, drag and wetting, respectively [35]. In this instance, surface topography is used by nature as a surface engineering tool to control the chemistry of the surface. Unlike semiconductors and polymers, applying effective patterning techniques to bulk metals is challenging due to their more demanding process requirements.

Figure 2:
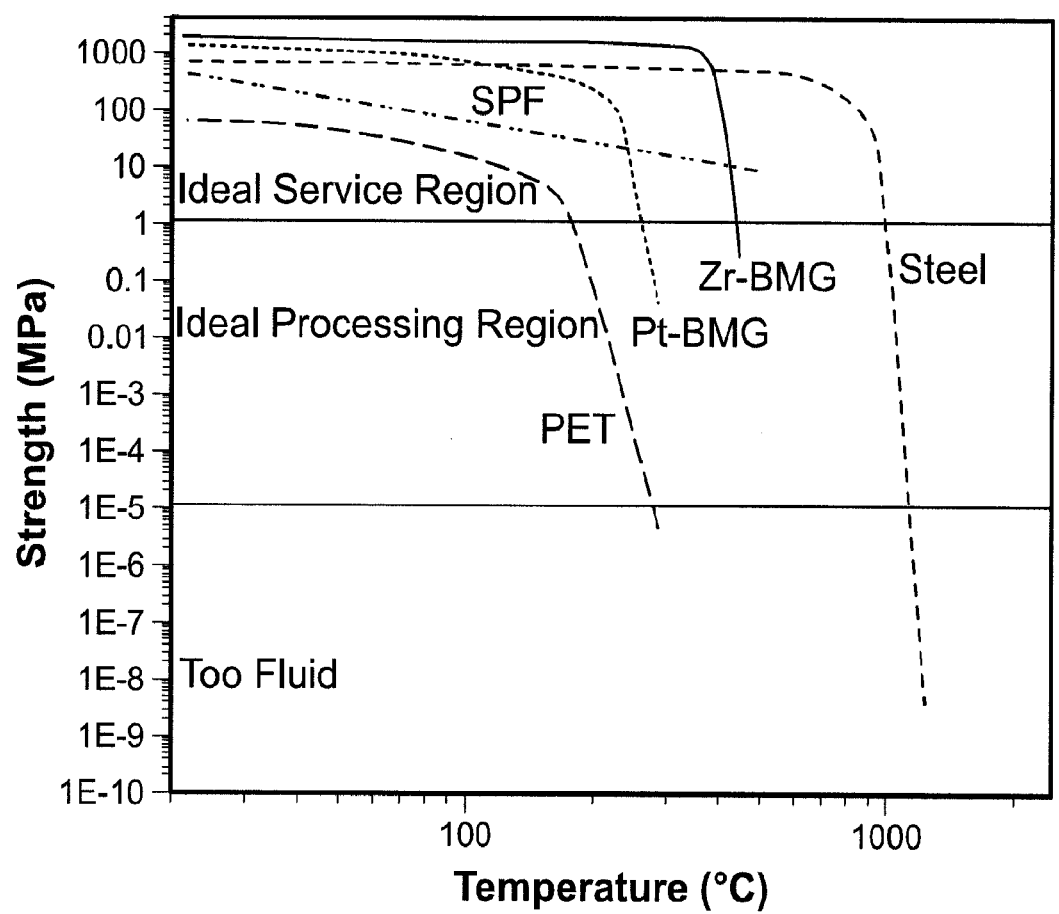
FIG. 2 is a plot of strength vs. temperature for various material systems. Properties vs. processability compared by the temperature dependent strength for conventional metals, SPF alloys, plastics, and BMGs. The lowest processing pressure defines the ideal processing region where effects like turbulent flow, wetting, and gravitational influences can be neglected on the time scale of the process. This region can be accessed by plastics, and also by some BMGs, but not by conventional metals nor by SPF alloys. In comparison to plastics, BMGs exhibit two orders of magnitude higher room temperature strength. Thus, BMGs can be considered high strength metals that can be processed like plastics.

Conventional bulk metals are generally either processed in their (low viscosity) liquid state or in their high strength solid state (FIG. 2). Alternative techniques based on selective surface modifications, such as dealloying, have been explored as a patterning method [36-39]. This approach has, however, limited control over the dimensions and accuracy of patterns compared to techniques used for polymers and semiconductors. If fabrication strategies similar to the ones used by nature (hierarchically patterned surfaces over multi-length scales and dimensions) can be developed for metals, impacts similar to the ones generated by the ability to pattern silicon and plastics can be expected.

Against this technical backdrop, the present disclosure addresses advantageous systems and methods for patterning and processing bulk metallic glass. A new class of metallic alloys—bulk metallic glasses (BMGs)—that solidify into an amorphous structure at moderate (<100 K/s) cooling rates have been developed [26]. Upon yielding, BMGs fail catastrophically along a single shear band, preventing macroscopic plasticity. This low resistance to shear localization is attributed to the absence of a strain hardening mechanism and may also derive from strain-softening effects [6] [10]. It was found, however, that significant plasticity in bending can be achieved for BMGs when used in dimensions smaller than 1 mm [40]. Thus, the macroscopic brittle behavior of BMGs can be mitigated when the sample size is limited to 1 mm or smaller in one dimension, which takes advantage of their enhanced plasticity and high strength. By increasing temperature and/or decreasing deformation rate, conversely, BMGs begin to deform more readily in a homogeneous and perfectly plastic manner [41, 42].

The transition from localized to homogeneous deformation is a function of temperature and strain rate. The temperature region where homogeneous deformation can be achieved under experimentally relevant strain rates is the supercooled liquid region (SCLR). During heating of the BMG into the SCLR, it first relaxes into a supercooled, metastable liquid at the glass transition temperature before it eventually crystallizes at the upper bound of the SCLR. As a consequence of the SCLR where the BMG softens and flows homogenously, thermoplastic forming (TPF) can be performed for some BMGs under pressures and temperatures similar to those used for plastics. As a consequence, highly versatile and inexpensive structuring methods similar to those used for plastics can be adopted for the TPF based processing of BMGs. A utilization of such processing methods requires a fundamental understanding of the transition from localized to homogeneous deformation, in particularly on the nano and sub-nano length scale.

Figure 3:
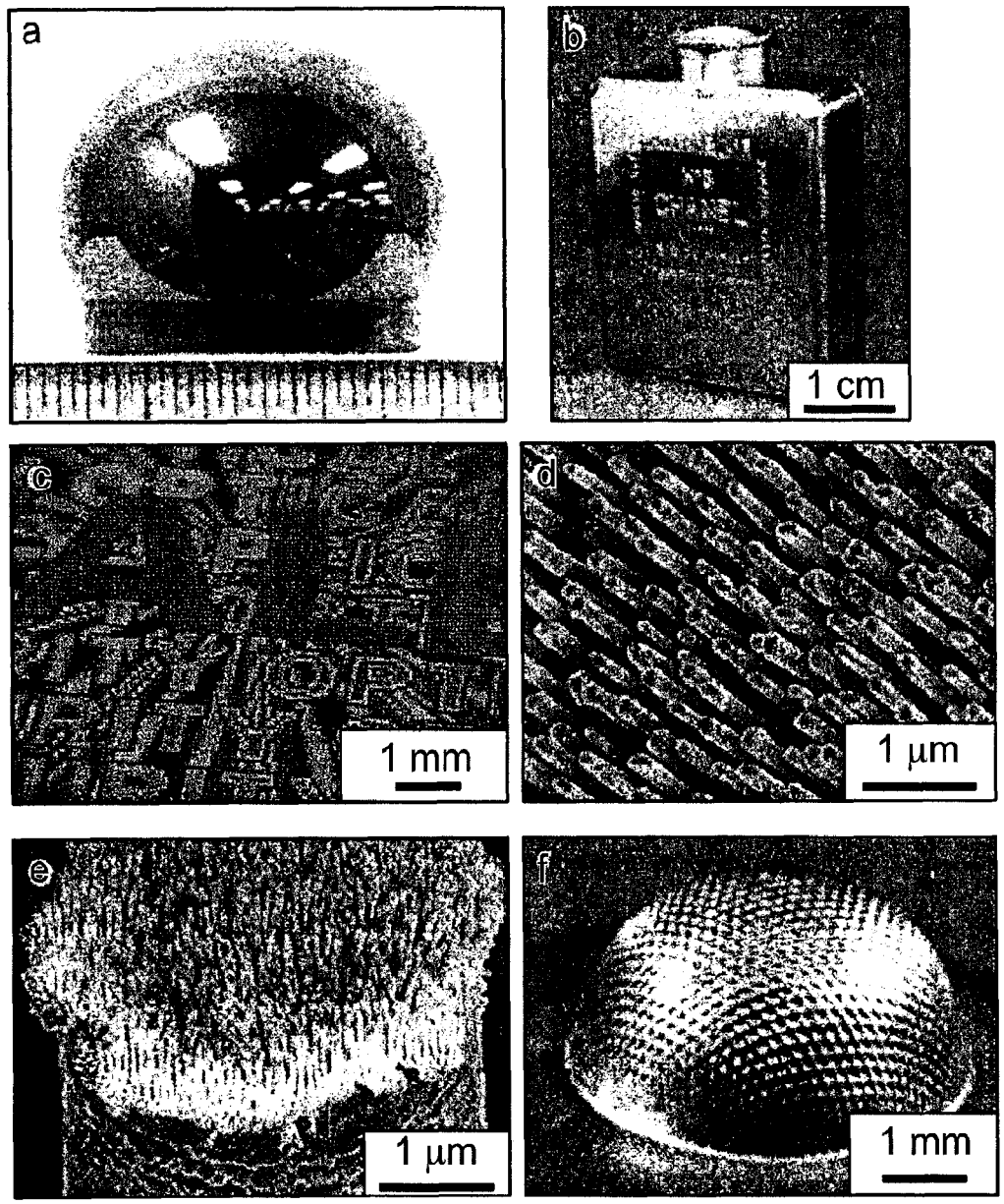
FIG. 3 is a series of images (a-f) related to thermoplastic forming of BMG materials. Examples of thermoplastic forming (TPF) based processing of BMGs: Blow molding during free expansion (a) and into a mold cavity (b). Precise structuring of the BMG surface is possible through imprinting features on ~600 nm length scale (c) and 100 nm length scale (d). Hierarchically patterned surface (e) and a nonplanar patterned surface (f) fabricated through a combination of blow molding and imprinting.
Figure 4:
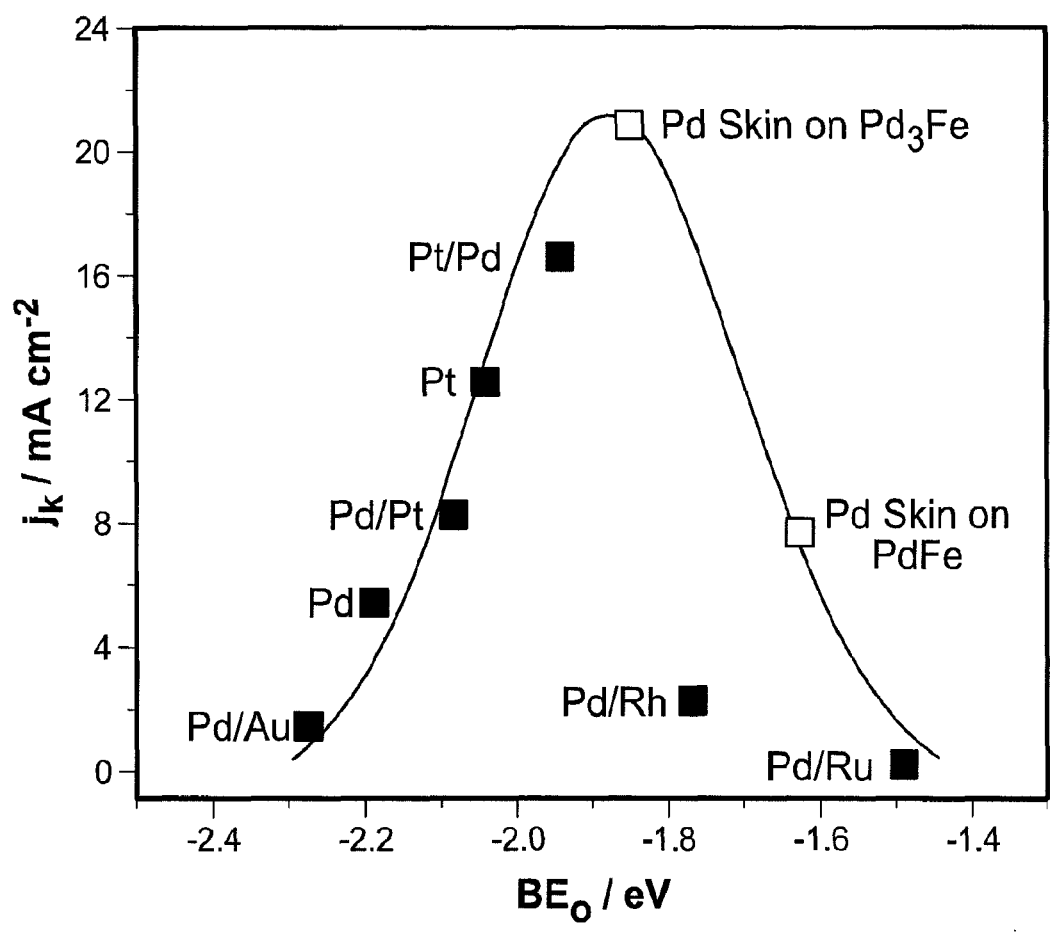
FIG. 4 is a plot of oxidation reduction reaction (ORR) activity for various metals. Volcano dependence of the Oxidation Reduction Reaction (ORR) activity (expressed as the kinetic current density at 0.8 V vs. RHE; rotation rate 1600 rpm; room temperature) on the calculated oxygen-binding energy. These plots are useful in characterizing the surface chemistry (binding energy) of various materials systems.

The processing ability of BMGs enables a highly versatile method to create hierarchically patterned surfaces of 3D metallic objects over multi-length scales, similar to the nanopatterns illustrated in FIGS. 3d and e (adapted from [26]) as well as conventional catalysts.

Thus, according to the present disclosure, bulk metallic glass alloys are provided that may be processed to achieve effective surface patterning, combined with controlled chemistry in metals to achieve properties (combinations) that are otherwise unachievable. Previous development efforts for advancing these materials relied on changing the compositions step by step, which is inefficient [17, 43, 44]. According to the present disclosure, BMGs are designed using combinatorial synthesis techniques to create surfaces with controlled characteristics. By using the disclosed combinatorial approach, new BMG alloys are created much more rapidly, and these alloys may be advantageously malleable into a variety of different shapes (FIG. 3) with tunable surface chemistry.

According to the present disclosure, a process for generating a thin film library and assembly of predictive parameters for the glass forming ability of new metallic alloy systems is provided. A physical vapor deposition process is provided that may be used to create deposition gradients across a substrate. The selected materials are thermally co-evaporated inside of an Angstrom AMOD deposition system. The materials systems is deposited onto a micro-fabricated sample array forming a thin film library. The compositions of the samples may be measured using an energy-dispersive X-ray fluorescence spectrometer (EDX) and the phases identified with an imaging-plate X-ray diffractometer (IP-XRD) [30]. A composition and phase state distribution may be created for each system. Based on the noted processing, material systems/samples that exhibit desirable properties may be scaled into a larger sample size for further fabrication, patterning and surface chemistry studies. As new material libraries are formed, the intrinsic properties of newly discovered BMGs may be measured and predictive models for glass-forming ability developed. In this regard, there is a critical need in the field to correlate the glass-forming ability of BMGs with measurable thermodynamic properties [45]. Successful correlations will be able to predict the critical cooling rate, Rc, for a given system.

In addition, patterned bulk metallic glass alloys of the present disclosure may be employed for various energy/fuel cell systems, e.g., direct alcohol fuel cell and battery applications, particularly by patterning the BMGs into nanostructured shapes with high surface areas, e.g., nanofibers (FIG. 3d and FIG. 3e). The performance characteristics of these materials may be correlated with the physiochemical properties determined using scanning electron microscopy, transmission electron microscopy, x-ray photoelectron spectroscopy, and/or Brunauer-Emmett-Teller (BET) analysis. The activity of these materials may also be characterized using standard electrochemical methods, such as cyclic voltammetry, chronoamperometry, and electrochemical impedance spectroscopy.

The present disclosure thus provides and permits formation of BMG nanowires ($\Phi$<10 nm) that have significant energy applications, e.g., by interfacing these materials with graphene and carbon nanotubes. Exemplary implementations of the present disclosure have been undertaken whereby patterned BMG nanowires with diameters ca. 15 nm have been fabricated. Even smaller diameters may be achieved using alternative processing techniques, e.g., using atomic layer deposition to shrink the pore size of anodized aluminum oxide (AAO) templates down to <5 nm. In this way, BMG nanowires may be achieved with large (>200) L/D ratios, where the diameters are on the same length scale as conventional catalyst particles. Nanowires on this same scale may also be employed for transparent conductive electrodes, e.g., for use in organic solar cell applications. Still further, patterned surfaces of BMGs (FIG. 3) may be employed as catalyst templates for growing aligned carbon nanotube forests or large area continuous graphene sheets, potentially yielding a new generation of energy conversion and storage devices that exploit metallic and graphene (CNT) interfaces.

1. Gradient Thin Film Development

Figure 5:
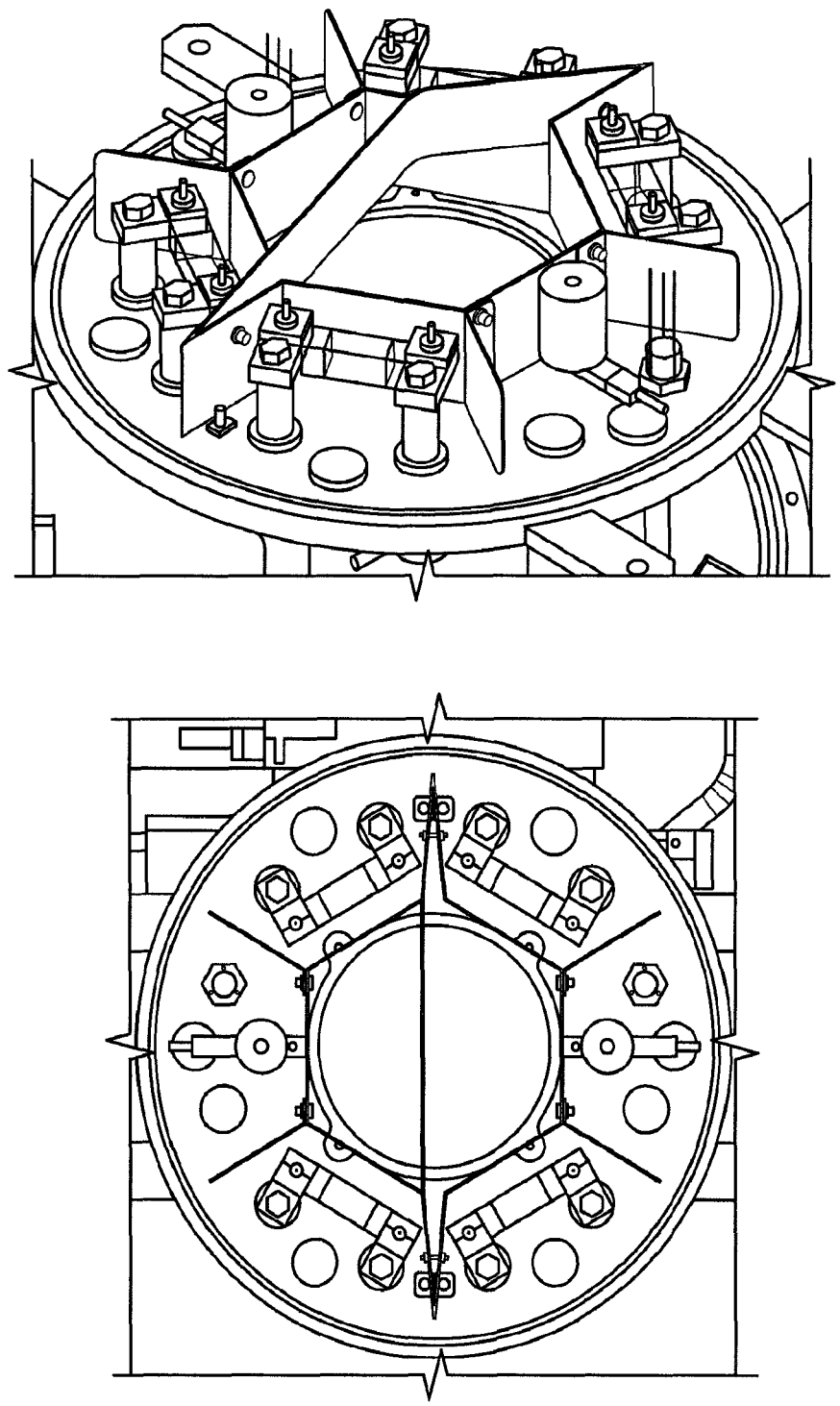
FIG. 5 provides schematic illustrations of an exemplary resistive base plate assembly. Resistive base plate assembly: left—orthogonal view, right—top view. System has 6 evenly spaced sources in a circular arrangement around the substrate, which is located in the center. Two quartz crystal microbalance sensors can allow two materials to be co-deposited simultaneously.

An Angstrom Engineering AMOD system (FIG. 5) may be used to create a thin film library. Traditional multi-source physical deposition systems are designed to maximize uniformity across a substrate. This uniformity is typically accomplished by placing the source targets at angles less than 60° from the normal axis of the sample. The AMOD system may be used in a manner that will allow the evaporation sources to create a gradient across the sample. By positioning the sources outward from a centrally mounted substrate, a gradient will be created when the substrate is not rotating.

Figure 1:
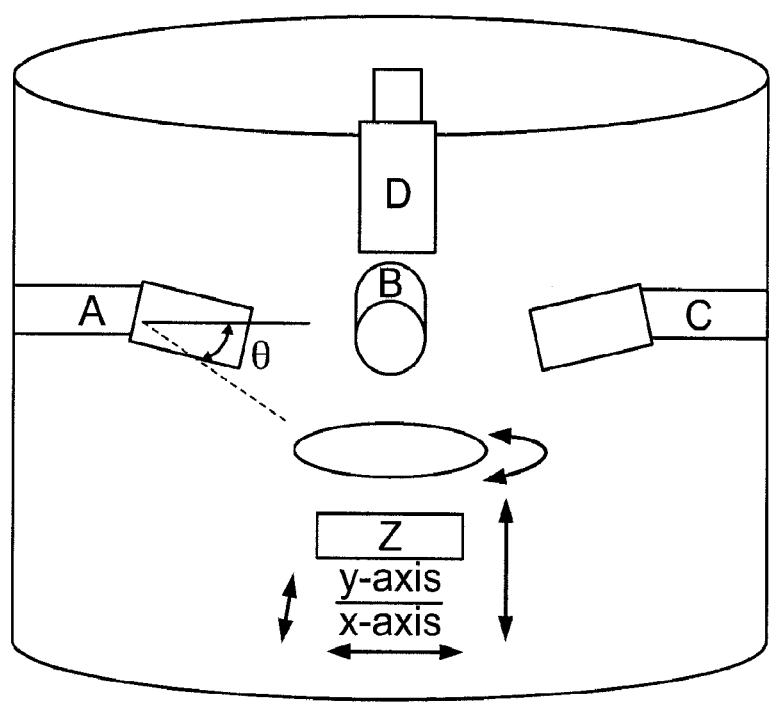
FIG. 1 is a schematic depiction of a combinatorial target-substrate system according to the present disclosure. The angle $\Theta$ can be changed between targets A, B, C and the substrate to vary the spread of the compositional library over the substrate. Combining this feature with target D enables the creation of 3D projections on the substrate of 4 component phase diagrams.

The gradients across the sample can be further tuned by adjusting deposition rates of the respective sources along with the position of the stage along the x, y and z axis (FIG. 1). When evaporating a material, the deposition rate varies in both the x and y axes. The rate varies according to a cosine distribution providing a natural gradient [78]. In a typical deposition system the substrate is rotated to compensate for the gradient providing a uniform layer. By removing this rotation and by positioning the evaporation sources outward from the center of the system, overlapping gradients can be formed from different sources relative to their positioning in the system. These overlapping gradients will provide the opportunity to evaluate many combinations of materials that will be present on a single thin film substrate library.

For samples that show promise based on material properties and composition, the sample stage can be rotated and the source positions adjusted to give a uniform composition over a larger area. This can be accomplished by mounting evaporation sources such that their position can be adjusted linearly inward. Initially a two material gradient will be evaluated to ensure process feasibility. Two more sources may be added orthogonally to achieve predictable results based on the lessons learned from the two material gradients. Adding rate sensors and power controllers to individually control the sources may enhance system performance. Repositioning of the sources so they are at a 90° separation may also be beneficial. In some cases, thermal sources may not be the best solution for depositing all materials. In such circumstances, it may be desirable to use an AMOD system that has two sputtering sources and four thermal sources, and such sources could be modified with additional capabilities, such as electron beam evaporation and individual rate control.

2. Thin Film Library

Figure 6:
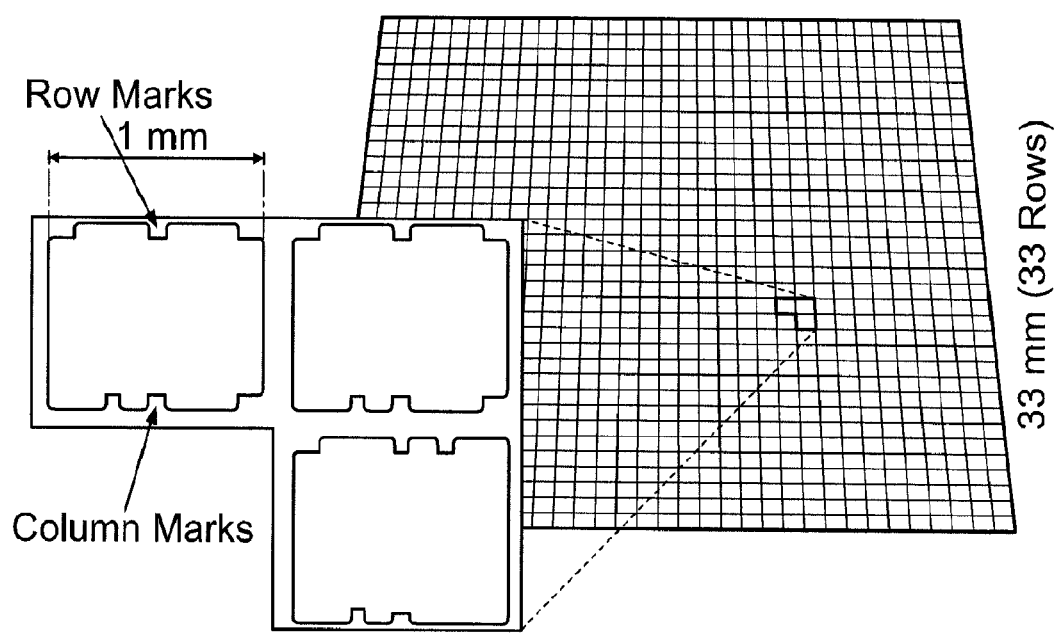
FIG. 6 is a depiction of an exemplary thin film library deposited onto a (33×33) MEMs grid array (1,089 samples). A wall is removed after deposition, allowing separation of each sample having a 1×1 $mm^2$ area.

Recently, a combinatorial arc plasma discharge system has been used to create a metallic glass thin film library [30, 79]. The equation libraries were deposited onto a 33×33 array that was separated into 1,089 samples (FIG. 6). A similar approach may be used for building a BMG thin film library by depositing the materials on top of a MEMs grid array. The position of each sample may be identified by 5-bit row and column marks in the trench MEMs grid. The thickness of each sample may be measured using a white light interferometer (Zygo) [82]. Films with thicknesses greater than 200 nm may be measured to avoid the influence of Si in the substrate. The compositions of the films may be measured using EDX and the phases measured using an X-ray diffractometer (XRD).

Samples classified as amorphous may be identified for scale up and further study. If the presence of nanocrystals in the amorphous samples cannot be identified using XRD, further observations may be made from the electron diffraction patterns. The resistivity of the amorphous samples may be measured using a micro-four-point probe system [83]. Of note, the pitch of these probes (200 μm) are very large compared to the sample size (1×1 mm$^2$). Hence, this measurement will only be relative prior to scale up. In all, the thickness, composition, phase, and resistivity measurements may be carried out without detaching the samples from the thin film library. Absolute resistivity along with $T_g$ (glass transition temperature), Tx (onset crystallization temperature), and $T_1$ (liquidus temperature) may be measured on the larger scale samples.

3. Assembly of Predictive Parameters for the Glass Forming Ability of New Metallic Alloy Systems Towards optimizing the chemistry of BMGs for improved thermal stability, Dulikravich et al. suggested that an advanced multi-objective optimization algorithm be used so that only a minimum number of BMGs need to be manufactured and tested in order to verify the predicted performance of the BMG compositions [84]. According to the present disclosure, the key components necessary to determine the glass forming ability of a given system will be identified with the lowest possible cooling rate, Re. To accomplish this objective, the following critical parameters may be used to predict the glass forming ability. The most extensively used criteria are the reduced glass transition temperature $T_{rg}$, the supercooled liquid range $\Delta Tx$, and the parameter γ (Eqns. 1-3, respectively).

$$T_{rg}=T_g/T_1 \qquad \text{(Eqn. 1)}$$

$$\Delta T_x=T_x-T_g \qquad \text{(Eqn. 2)}$$

$$\gamma=T_x/(T_g-T_1) \qquad \text{(Eqn. 3)}$$

where $T_g$, $T_x$, and $T_1$ denote the glass transition temperature, the onset of crystallization temperature, and the liquidus temperature, respectively. Of note, Long et al. have suggested a new criterion, ω, for predicting the glass forming ability based on the consideration of both the resistance of the amorphous phase against crystallization and the stability of undercooled liquid against the competing crystalline phase formation [45, 85]. As more accurate glass forming ability predicting criterion are developed, the data collected from the thin film libraries developed according to the present disclosure will be tremendously useful and serve as a strong guideline for computational simulation to predict new BMGs with target properties.

According to the present disclosure, characterization of BMG materials for fuel cell and battery applications is also undertaken. As noted above, BMG nanowires offer significant advantages for fuel cell applications because the diameters can be formed on the same order of scale as conventional catalysts. In addition, the multi-component nature of the BMG alloys can give several advantages over pure metallic systems that could yield higher activity and longer durability.

4. Preliminary Results: Fuel Cell Catalysts

Figure 7:
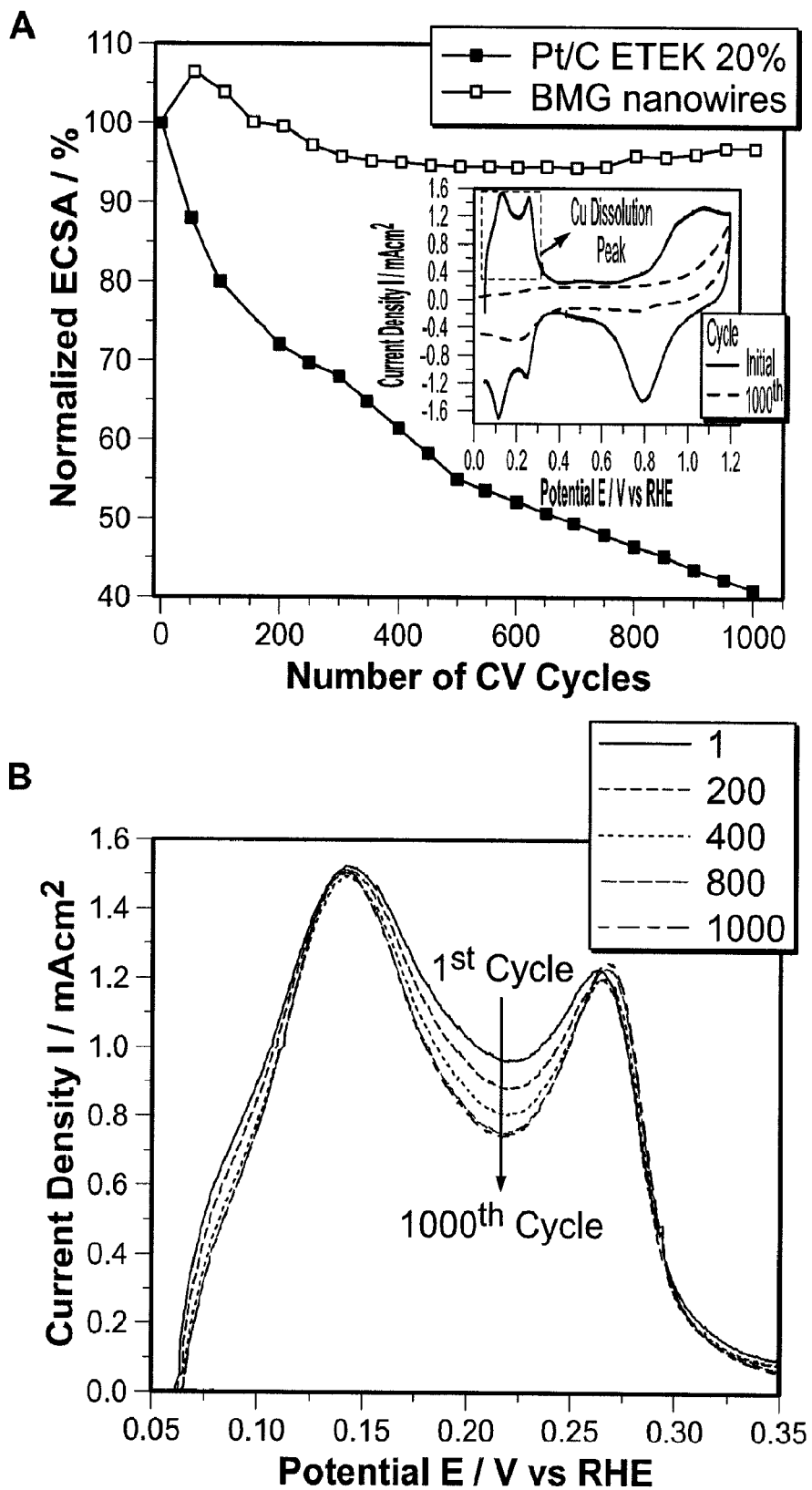
FIG. 7 are plots showing the superior performance of electrocatalytic systems according to the present disclosure. A) Loss of electrochemical surface area (ECSA) of BMG and Pt/C (ETEK) catalysts with number of CV cycles in nitrogen-purged 0.5M $H_2SO_4$ solution, at 60° C. The BMG catalyst maintains ~96% initial performance, while the ETEK catalyst decreases by ~60%. Inset: Cyclic voltammograms (initial and after 1000 cycles) of BMG nanowires catalysts. B) Hydrogen under potential deposition region (UPD) from the cyclic voltammograms used for measuring the ECSA of BMG catalysts at 60° C. from 0 to 1000 cycles. The CVs were recorded in $N_2$-saturated 0.5 M $H_2SO_4$ solution at room temperature. Scan rate: 20 mV/s.

From among ten different amorphous alloys considered, the bulk metallic glass with the easiest malleability was found to be $Pt_{57.5}Cu_{14.7}Ni_{5.3}P_{22.5}$ [86]. Pt-BMG nanowires are also contemplated, e.g., using nanoimprint lithography. Pt-BMG nanowires have been evaluated for activity and durability (FIG. 7) [87; incorporated herein by reference]. Accelerated fuel cell durability comparisons (FIG. 7) under fuel cell operating temperatures (60° C.) reveal that BMG nanowires maintain their electrochemical surface area (ECSA) in comparison to conventional Pt/C catalysts [87]. The BMG ECSA shows a slight initial increase followed by level stability around 200 cycles of 96%. The commercial Pt/C catalyst loses about 60% of the original ECSA value after 1000 cycles. This loss for the Pt/C can be attributed to the agglomeration and dissolution of platinum nanoparticles.

Figure 8:
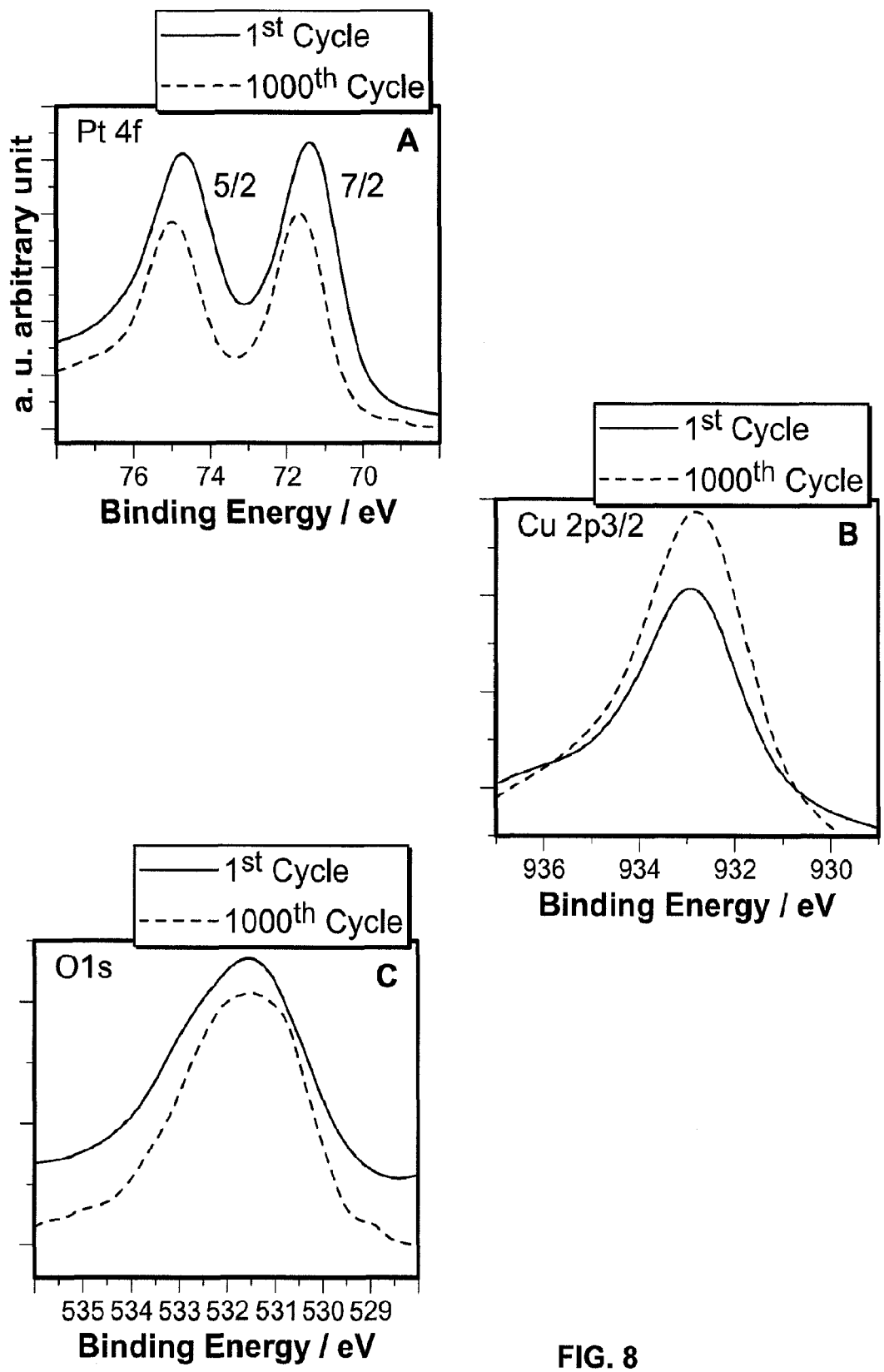
FIG. 8 are x-ray photoelectron spectroscopic plots for various material systems, namely A) Pt 4f, B) Cu2p3/2 and C) O1s performed on the BMG electrode before and after 1000 CV cycles (durability test).

5. Higher Catalytic Activity of BMGs Due to De-Alloying Effects:

X-Ray photoelectron spectroscopy (XPS) spectra (FIGS. 8A-C) for Pt-BMG before and after cycling (1000 cycles) at 50 mVs$^{-1}$, showed the Pt 4f region of the Pt spectrum, the most intense doublet (at ~71 and ~74 eV) is characteristic of metallic Pt. There was no indication of a second doublet (at ~72 and ~75 eV) that could be assigned to oxidized Pt in the forms of PtO and Pt(OH)$_2$. The negative shifts in the Pt 4f signal relative to Pt (after 1000 CV cycles) are an indication of electron transfer from the Cu and/or Ni atoms to the neighboring more electronegative Pt atoms [88-90]. The Pt-BMG has an enhanced Pt-rich surface and lower Cu content after cycling, and we could demonstrate the change in the Cu 2p3/2 peak position (FIG. 8B). The low atomic nominal concentration of Ni and the low atomic weight of P ($Pt_{58}Cu_{15}Ni_5P_{22}$) were not detectable by XPS or TEM.

The surface of the Pt-BMG was characterized by measuring the voltammetric response of a BMG nanowire electrocatalyst during slow potential (20 mVs$^{-1}$) cycles between 0.05 and 1.2 V vs. RHE. The anodic peaks indicated by the arrow at 0.3-0.4 V on the initial CV imply selective Cu dissolution from the BMG electrode material [91, 92] (inset of FIG. 7). This de-alloying effect suggests that the changing surface of the BMG nanowires leads to a higher activity [91, 92]. After 1000 cycles, the observed CV stabilized, indicating that Cu dissolution from the BMG surface had either ceased or dropped to undetectable levels (FIG. 8B). The initial results from these preliminary studies indicate that BMGs could have tremendous potential for applications that involve electrochemical interfaces (i.e. fuel cells, batteries, advanced sensors, MEMs/NEMs).

Figure 9:
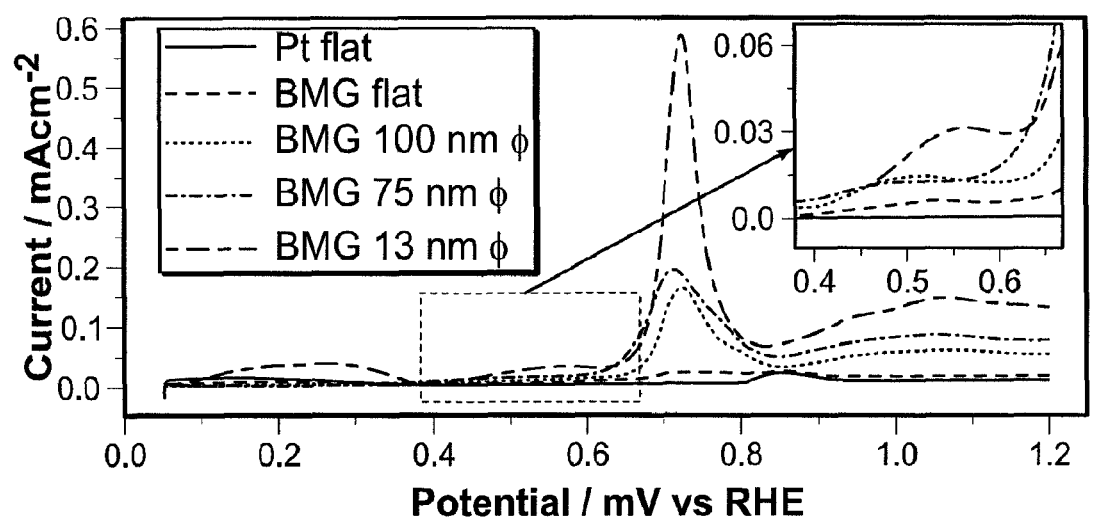
FIG. 9 is a plot of CO stripping that further demonstrates superior performance of electrocatalytic systems according to the present disclosure particularly for adsorbed CO oxidation for BMG nanowires over pure Pt. The wire diameters illustrate the higher surface area (performance) of the smaller diameter wires in the same fixed area and wire length.
Figure 10:
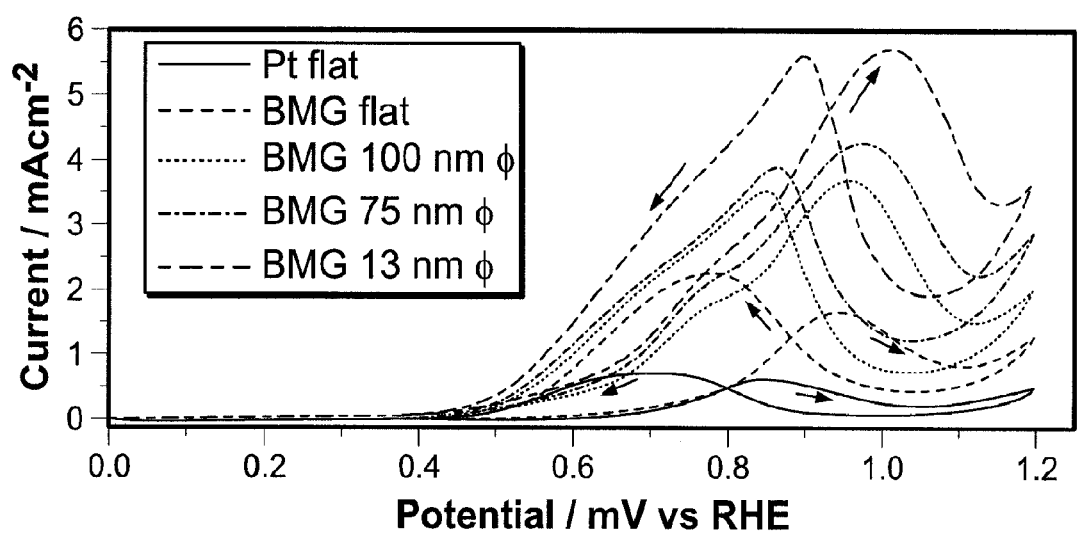
FIG. 10 is a plot showing ethanol oxidation that further demonstrates superior performance of electrocatalytic systems according to the present disclosure. Ethanol (1 $molL^{-1}$) oxidation illustrating superior catalyst performance of BMG materials for direct ethanol fuel cells in comparison to pure Pt.

6. Improved Alcohol Oxidation for BMG Catalysts with a Higher Onset Potential:

It is contemplated according to the present disclosure that nanowire alloys may match the electrocatalytic activity of the well-studied supported metal catalyst systems. However, there are very few (if any) studies that investigate CO oxidation, alcohol oxidation or oxygen reduction of these materials. As shown herein, BMG nanowires have a higher $CO_{ads}$ tolerance due to a higher onset potential for CO oxidation (FIG. 9). This suggests that the BMG nanowires are not as susceptible to self-poisoning (due to CO generation from the alcohol electro-oxidation step) as pure platinum. Electrochemical characterizations show a higher ethanol activity at higher potentials (E>-0.2 V) and demonstrate higher alcohol oxidation current densities for BMG materials compared to a pure Pt disc (FIG. 10). We will further characterize these materials in the proposed work.

7. BMG Alloys for Battery Applications

Presently, there is no literature that directly employs bulk metallic glass as an anode or cathode in a battery. There are a few examples of using metallic glasses as solid electrolytes, but these have not proved suitable for application due to low lithium conductivity. An abundance of literature has explored the application of metal alloys for use in lithium ion batteries. For example, Bensenhard showed that lithium-alloying mixtures of Sn—Sb and Sn—Ag were able to retain capacity better than Sn alone by decreasing matrix cracking due to expansion and contraction during lithiation/delithiation [93]. Recently, Si nanowires have gained attention due to the high theoretical capacity of Si (4200 mAh/g) compared to conventional graphite (372 mAh/g) [94]. Although it was shown that silicon nanowires could handle the (ca. 400%) volume changes during cycling [94], it is noted that the long term durability of this architecture is not feasible if the silicon nanowires are attached to bulk silicon that is still susceptible to pulverization/degradation.

8. BMG Advantages for Battery Applications:

Recognizing the advantages of BMG alloys for fuel cell applications, it is contemplated according to the present disclosure that comparable advantages will be realized for battery applications. BMG alloys are available with atomically dispersed materials that readily alloy with lithium (i.e., Si, Sn, Ge, etc.). Thus, exemplary implementations for battery applications may employ an Au-based BMG (e.g., $Au_{49}Ag_{5.5}Pd_{2.3}Cu_{26.9}Si_{16.9}$), e.g., as a suitable anode for lithium ion batteries. It is further contemplated that a BMG with an appropriate formulation of components can be formed into nanowires that can handle the volume changes due to lithium cycling. Several alloy systems, such as Sn—Co/C (600 mAh/g after 30 cycles) [95] and Sb/TiC/C (500 mAh/g after 100 cycles) [96] have been investigated and utilization of BMGs with these elements lend themselves to advantageous properties for battery applications.

According to the present disclosure, methods for forming BMG nanowires (Φ<10 nm) and new energy applications by interfacing these materials with graphene and carbon nanotubes are provided.

9. Preliminary Results: BMG Nanowire Fabrication Sequence.

The BMG nanowire fabrication sequence (FIG. 11) allows the diameter of nanowires to be controlled from ca. 100 nm to 10 nm (FIG. 12) with an aspect ratio up to 200:1 [97]. These length scales are very close to conventional supported catalyst particle dimensions [98]. In an exemplary fabrication process, the BMG is heated (250° C.) into the super cooled liquid region where it softens and under applied pressure (130 MPa) can be thermoplastically imprinted (FIG. 11c) so that the BMG fills the nanopores (FIG. 11d). Of note, the diameters of the BMG nanowires can be made even smaller dependent upon the template dimensions [97]. The anodized aluminum oxide (AAO) template is dissolved in KOH solution (FIG. 11e) to isolate the nanowires. FIG. 12 shows the a) SEM and b) TEM image of the BMGs. The uniform vertical nanowires are well-isolated and parallel to one another. The selected area diffraction image (FIG. 12c) suggests a polycrystalline Pt structure with a complete alloy formation.

10. BMG Nanowire Formation Study:

The physiochemical properties of the new BMGs may be determined using scanning electron microscopy, transmission electron microscopy, x-ray photoelectron spectroscopy, and Brunauer-Emmett-Teller (BET) analysis. Recently, shear transformation zones (STZs), a collective shearing of several hundred atoms, have been postulated as the carriers of plastic deformation to accommodate flow in amorphous metals. However, they remain hypothetical, since experimental evidence of their existence and characteristics is minimal. As new BMG materials are identified according to the present disclosure, the flow behavior of amorphous metals may be examined at the postulated size of the STZs in order to obtain experimental validation for these phenomena. Experimentally determined flow behavior may then be compared to a homogeneous flow model and further used to develop an improved flow model that considers STZs. In tandem, internal friction measurements may be conducted on nanoscale mechanical beam resonators to study the energy associated with a shear transformation event. These studies may be used to further characterize BMGs and provide an understanding of how the surfaces of these materials can be patterned to features <15 nm (FIG. 12B).

11. Synthesis of BMG Nanowires with Diameters <5 nm:

Commercially available anodized aluminum oxide (AAO) templates with pore diameters of 15 nm were used to nanoimprint the BMG nanowire shown in FIG. 10B. This limit may be pushed even smaller to determine what limits, if any, exist in BMG nanowire formation. For example, atomic layer deposition (ALD) may be used to constrict the pore size of the AAO template down to diameters <5 nm. The ALD method makes it possible to control pore diameters on the Angstrom scale even when the pore diameter is 10's to 100's of nanometers [99].

BMG nanowires may be fabricated according to the present disclosure with properties, compositions, and geometry suitable for high performance fuel cell catalysts. The melting temperatures of the disclosed BMGs are much lower than the estimated melting temperatures based on interpolation of the alloy constituents making them attractive as highly malleable materials. In fact, the high level of controllability of BMG materials over multiple length scales enables BMG nanowires to provide high platinum surface areas and dispersion without the need for a high-surface-area conductive support (e.g., carbon black). Pure metallic nanowires have previously been demonstrated to possess high surface areas, electron conductivity, and durability. The multimetallic composition of the BMGs not only reduces the loadings of precious metal (cost reduction), but can also improve the catalytic performance based on the previously described advantages of alloy catalysts.

Enhanced methanol and ethanol oxidation catalytic activity of BMG nanowires according to the present disclosure may be attributed to one or more of the following factors. First, it is known that the oxidation of organic molecules involves multistep adsorption and electron transfer, requiring multiple adjacent active Pt sites. The unique features of high surface area and Pt-enriched outermost surface of the BMG nanowires meet this requirement and thus are favorable for the oxidation of methanol and ethanol. According to the Butler-Vollmer equation, a crucial factor in improving fuel cell performance is to increase the value of exchange current $i_0$. Increasing $i_0$ can be achieved by using more effective catalysts and/or increasing the roughness of the electrode, which increases the surface area of the catalyst.

Thermodynamic derivation also define that voltage losses due to the electrical resistance of the electrodes, and resistance to the flow of ions in the electrolyte is proportional to the current, suggesting that one way to reduce internal resistance is the use of electrodes with the highest possible conductivity. The Pt-enriched nature of the outer surface enables all surface sites of the BMG nanowires to be highly conductive. Electron produced on the surfaces of the BMGs could flow across catalyst without encountering any significant ohmic barriers.

The high performance of the BMGs could also be attributed to the high intrinsic electrical conductance of these materials. This is conducive to the reaction kinetics on the catalyst surfaces, and hence may result in an enhancement in activity. Electron transport in the catalyst layer must not be ignored. It is especially important considering the fact that in the catalytic layer, effective conductivities range only from 300 to 500 $Sm^{-1}$ in the through-plane direction. The electrical resistance can cause a non-uniform distribution of the phase potential in the catalyst layer, and thus causes an uneven distribution of overpotential. As a result, the local current density distribution comes from the combined effects of non-uniform distributions of overpotential and reactant concentrations. From the Butler-Volmer, it is known that a slight change in overpotential (by the use, for example, of a less conductive electrocatalyst support) may have a significant effect on current density. The search for higher conductive materials is still in vogue, e.g., carbon blacks, carbon nanofibers, carbon nanotubes and graphene materials. Nevertheless, BMGs does not suffer from this issue and promotes fuel cell catalysts to a higher level in terms of higher electrical conductivities compared to supported catalysts as shown in the following Table. BMG conductivity exceeds that of carbon black by a factor of 4 orders of magnitude over carbon black and one order of magnitude of carbon nanotubes.

TABLE

Conductivity Values of Various Materials (Room Temperature)

| Material | Carbon Black | Carbon Nanotubes | Platinum | BMGs | Copper |
|---|---|---|---|---|---|
| Conductivity ($Sm^{-1}$) | 1-10 | 25,000 | 92,250 | 316,450 | 596,000 |

Finally, the electronic and strain effects may play a major role in the activity enhancement. It is known that alloying Pt with other metals can lower the electronic binding energy in Pt and promote the C—H cleavage reaction at low potential. On the other hand, the strains, which widely exist in the dealloyed materials, have also been demonstrated to be favorable for the enhancement of electrocatalytic activity in Pt-based alloys. The enhanced activity for the methanol and ethanol oxidation Pt BMGs with respect to pure Pt can also be ascribed to the synergetic effect of Cu and Ni oxides. These interactions promote the formation of hydroxyl species by dissociating water at a lower potential with respect to the pure Pt catalysts. Moreover, this interaction could also weaken the bonding between the hydroxyl species and the catalyst surface as compared with the bonding on Pt conventional catalysts. The more weakly adsorbed hydroxyl species further promote the electro-oxidation of adsorbed CO and/or methanol/ethanol sub products species on the active metal sites at lower potentials, thus improving the performance.

Thus, the methanol oxidation and ethanol oxidation activity and stability of Pt electrodes may be enhanced through BMG construction, surpassing the performance of Pt conventional catalyst. In addition, designs may also be based on different combinations of metals. The disclosed generation of supportless alloy-electrocatalysts based on Pt, which, because of their unique combination of different alloys, have the potential to combine the advantages of platinum-black, Pt/C, platinum nanotubes and Pt-M catalysts, while overcoming their drawbacks. Specifically, the disclosed electrocatalysts have the potential to possess low cost, high surface area, high utilization, high activity, and high durability.

12. New Energy Applications— a. BMGs as Transparent Conductive Electrodes for Solar Cell Applications: BMG Nanowire Network.

Transparent conductive materials pervade modern technology, providing critical components for touch screens, organic light emitting diodes (OLEDs) and solar cells. Presently, the most common materials used are doped metal oxide films such as tin-doped indium oxide (ITO), which has dominated the field for several decades. The widespread application of these materials could largely be attributed to the ability to deposit these materials with controlled parameters including thickness and doping concentration. However, emerging large area solar cell devices raise new requirements for transparent conductive electrodes (TCEs) that are thin, flexible, and compatible with large scale manufacturing methods under a low cost. These requirements limit the use of ITO because ITO films are brittle, restricting their use in flexible optoelectronic devices. In addition, the limited availability of indium will continue to drive up the cost of ITO.

BMG nanowires have been created according to the present disclosure with 15 nm diameter and aspect ratio around 200 with amorphous structure. By using a template with smaller pore diameters and controlling the imprinting temperature and pressure, crystalline BMG nanowires may be obtained with diameters <5 nm and aspect ratio in the range of 500 to 1000. It is contemplated that such BMG nanowire network may perform effectively as transparent conductive electrodes (TCEs) for organic solar cells.

13. Preliminary Results: Transparent Conductive Electrodes for Solar Cell Applications According to the present disclosure, processes for making transparent conductive electrodes using carbon nanotubes have been developed. FIG. 13 shows that the nanotube type and post processing (i.e. acid treatment) can further improve the conductivity of these films.

14. Carbon Nanotube Transparent Conductive Electrodes:

Carbon nanotube (CNT) networks are promising candidates for transparent electrodes in organic solar cell applications. CNT can be produced in large quantities by CVD and/or arc-discharge methods and can be deposited, transferred, and patterned on various substrates with cost-efficient solution processes. FIG. 13a illustrates the difference between CNTs synthesized by arc discharge and the HiPco (high pressure CO) process. The arc discharge method typically creates CNTs with a longer length and larger diameter over the HiPco process. This is desirable because the sheet resistance of the CNT network film consists of the sum of the resistances of the nanotubes itself and the nanotube-nanotube junction resistances. Although the conductivity of an individual nanotube is very high, the high resistance at the nanotube-nanotube junction limits the overall conductance of the films. Thus, CNT film properties depend on the following parameters: the nanotube length [100], the nanotube diameter, the deposition method, the nanotube chirality [101] and doping level [102]. For conductive films, longer single walled carbon nanotubes (SWNTs) are preferred to minimize the negative effect of the highly resistive CNT-CNT junctions. SWNTs with larger diameters are preferred because of the band gap of semiconducting-SWNTs is inversely proportional to their diameters.

As shown in FIG. 13a, the arc discharge (darker dots) CNTs films exhibit a higher performance over the HiPco films (lighter dots). Acid treatment of SWNTs films has been shown to improve the optoelectronic performance of SWNT films. Acid treatment effects are two-fold: on one hand, it p-dopes SWNTs and results in lower junction resistance [103]; on the other hand, it removes residual surfactants leading to a denser film [104].

Figure 14:
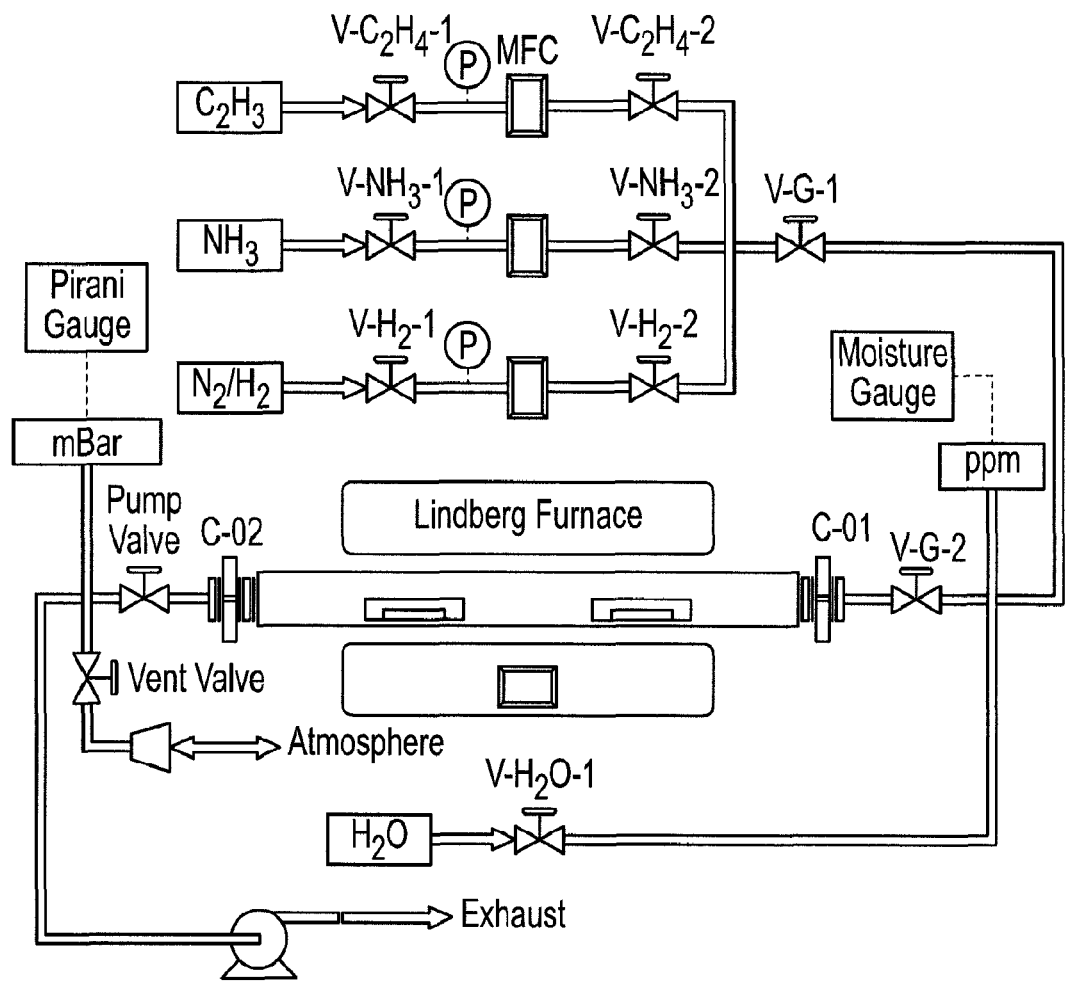
FIG. 14 is a schematic depiction of an exemplary CVD setup for supergrowth CNT/graphene systems. Schematic of CVD Setup for Supergrowth CNT/Graphene. This system can be used to dope these materials in-situ during growth. Patterned BMGs will be used as templates for growing these materials.

15. Doped SWNT/BMG Composite Network TCEs:

SWNTs and BMG nanowires composite network may effectively replace ITO. Mixing BMG nanowires with SWNT films to lower the junction resistance of these films may be advantageous. A BMG material having a high work function could reduce the junction resistance between nanotubes. Pt has a higher work function than gold and could form an ohmic contact with SWNTs. Thus, these nanowires could be ideal bridges to connect SWNTs together with low junction resistance. In-situ doping of carbon nanotubes and graphene. It is contemplated to build a CVD system (FIG. 14) that will synthesize: (a) SWNTs with different diameters and study the effect of the SWNT diameter on their TCE performances; and (b) nitrogen or boron doping effects on the TCE performance. To realize a TCE with outstanding performance, long-strand, large and well-controlled diameter single-walled carbon nanotubes are highly desirable. In all semiconductor applications, the properties of a device depend on the control of the electronic states in the valence and conduction bands for design and optimization purposes. Various work by M. Torrenes et. al.[105-108] revealed that N-doping increases the number of states in the nanotube conduction band and therefore doped carbon nanotubes exhibit metallic behavior.

B-doped nanotubes have a reduced room-temperature resistivity ($7.4 \times 10^{-7}$-$7.7 \times 10^{-6}$ $\Omega$m) as compared to pure nanotubes ($5.3 \times 10$-6-$1.9 \times 10$-5 $\Omega$m)[109] while the room-temperature conductivity measured on nitrogen doped carbon nanotubes was found to be $2.9 \times 10^{-5}$ $\Omega$m with (4.0% wt N incorporation). Furthermore, first principle simulation predicts that the doping of Nitrogen (electron donor) shift the fermi level of a pristine carbon nanotubes towards the conduction band. Further substitution of Nitrogen leads to alteration of conduction band structure across the lattice where the lowest conduction energy band fermi level. [110]

16. BMG Nanowires as Templates for Doped Carbon Nanotubes and Graphene:

It is contemplated that patterned Fe-BMGs and Cu-BMGs may be used as templates to grow aligned carbon nanotubes and large area graphene. Vertically aligned carbon nanotubes have previously been demonstrated using $Fe/Al_2O_3$ catalysts [111] and graphene using copper foils [112]. Successful demonstrations such as vertically aligned BMG nanowires with carbon nanotube forests projecting from the exterior surface could open up a new realm of possibilities for energy conversion and storage devices that can exploit these metallic/graphene interfaces.

Thus, the present disclosure provides advantageous systems and methods for fabricating BMG nanowires with highly advantageous electrochemical properties. New BMG materials may be identified and/or developed using the high throughput screening techniques described herein. The disclosed BMG materials have widespread utility in electrocatalytic applications, e.g., in energy conversion and storage devices (e.g., fuel cells, batteries, solar cells and the like). Of note, the unifying material properties of the disclosed materials involves, inter alia, advantageous glass forming abilities of the alloy. Although the present disclosure has been provided with reference to exemplary embodiments and implementations of the disclosed systems and methods, the present disclosure is not limited by or to such exemplary embodiments and/or implementations. Rather, the systems and methods of the present disclosure may be modified, varied, enhanced and/or refined without departing from the spirit or scope hereof.

REFERENCES

1. Klement, W., R. H. Willens, and P. Duwez. Non-Crystalline Structure in Solidified Gold-Silicon Alloys, Nature, 1960. 187(4740): p. 869-870.
2. Wang, W. H., C. Dong, and C. H. Shek. Bulk metallic glasses, Materials Science & Engineering R-Reports, 2004. 44(2-3): p. 45-89.
3. Inoue, A. and T. Zhang. Fabrication of bulk glassy Zr55Al10Ni5Cu30 alloy of 30 mm in diameter by a suction casting method, Materials Transactions Jim, 1996. 37(2): p. 185-187.
4. Ashby, M. F. and A. L. Greer. Metallic glasses as structural materials, Scripta Materialia, 2006. 54(3): p. 321-326.
5. Hufnagel, T. C. Preface to the viewpoint set on mechanical behavior of metallic glasses, Scripta Materialia, 2006. 54(3): p. 317-319.
6. Johnson, W. L. Bulk glass-forming metallic alloys: Science and technology, Mrs Bulletin, 1999. 24(10): p. 42-56.
7. Schroers, J. and W. L. Johnson. Ductile bulk metallic glass, Physical Review Letters, 2004. 93(25): p. 255506.
8. Schroers, J. and N. Paton. Amorphous metal alloys form like plastics, Advanced Materials & Processes, 2006. 164(1): p. 61-63.
9. Inoue, A., B. L. Shen, H. Koshiba, H. Kato, and A. R. Yavari. Cobalt-based bulk glassy alloy with ultrahigh strength and soft magnetic properties, Nature Materials, 2003. 2(10): p. 661-663.
10. Schuh, C. A., T. C. Hufnagel, and U. Ramamurty. Overview No.144—Mechanical behavior of amorphous alloys, Acta Materialia, 2007. 55(12): p. 4067-4109.
11. Guo, H., P. F. Yan, Y. B. Wang, J. Tan, Z. F. Zhang, M. L. Sui, and E. Ma. Tensile ductility and necking of metallic glass, Nature Materials, 2007. 6(10): p. 735-739.
12. Schuster, B. E., Q. Wei, M. H. Ervin, S. O. Hruszkewycz, M. K. Miller, T. C. Hufnagel, and K. T. Ramesh. Bulk and microscale compressive properties of a Pd-based metallic glass, Scripta Materialia, 2007. 57(6): p. 517-520.
13. Volkert, C. A., A. Donohue, and F. Spaepen. Effect of sample size on deformation in amorphous metals, Journal of Applied Physics, 2008. 103(8): p. 083539.
14. Inoue, A., T. Zhang, and T. Masumoto. Zr—Al—Ni Amorphous-Alloys with High Glass-Transition Temperature and Significant Supercooled Liquid Region, Materials Transactions Jim, 1990. 31(3): p. 177-183.
15. Peker, A. and W. L. Johnson. A Highly Processable Metallic-Glass—Zr41.2ti13.8cu12.5ni10.0be22.5, Applied Physics Letters, 1993. 63(17): p. 2342-2344.
16. Duan, G., A. Wiest, M. L. Lind, J. Li, W. K. Rhim, and W. L. Johnson. Bulk metallic glass with benchmark thermoplastic processability, Advanced Materials, 2007. 19(23): p. 4272-30 .
17. Ponnambalam, V., S. J. Poon, and G. J. Shiflet. Fe—Mn—Cr—Mo—(Y,Ln)-C—B (Ln=lanthanides) bulk metallic glasses as formable amorphous steel alloys, Journal of Materials Research, 2004. 19(10): p. 3046-3052.
18. Lu, Z. P., C. T. Liu, J. R. Thompson, and W. D. Porter. Structural amorphous steels, Physical Review Letters, 2004. 92(24).
19. Zhang, Q. S., W. Zhang, and A. Inoue. New Cu-Zr-based bulk metallic glasses with large diameters of up to 1.5 cm, Scripta Materialia, 2006. 55(8): p. 711-713.
20. Xu, D. H., G. Duan, W. L. Johnson, and C. Garland. Formation and properties of new Ni-based amorphous alloys with critical casting thickness up to 5 mm, Acta Materialia, 2004. 52(12): p. 3493-3497.
21. Lin, X. H. and W. L. Johnson. Formation of Ti—Zr—Cu—Ni Bulk Metallic Glasses, Journal of Applied Physics, 1995. 78(11): p. 6514-6519.
22. Inoue, A., A. Kato, T. Zhang, S. G. Kim, and T. Masumoto. Mg—Cu—Y Amorphous-Alloys with High Mechanical Strengths Produced by a Metallic Mold Casting Method, Materials Transactions Jim, 1991. 32(7): p. 609-616.
23. Nishiyama, N. and A. Inoue. Supercooling investigation and critical cooling rate for glass formation in P—Cu—Ni—P alloy, Acta Materialia, 1999. 47(5): p. 1487-1495.
24. Schroers, J., B. Lohwongwatana, W. L. Johnson, and A. Peker. Gold based bulk metallic glass, Applied Physics Letters, 2005. 87(6): p. 61912.
25. Schroers, J. and W. L. Johnson. Highly processable bulk metallic glass-forming alloys in the Pt—Co—Ni—Cu—P system, Applied Physics Letters, 2004. 84(18): p. 3666-3668.
26. Schroers, J. Processing of bulk metallic glass, Advanced Materials, 2010. 22: p. 1566-1597.
27. Drews, J. Drug discovery: A historical perspective, Science, 2000. 287(5460): p. 1960-1964.
28. Cui, J., Y. S. Chu, O. O. Famodu, Y. Furuya, J. Hattrick-Simpers, R. D. James, A. Ludwig, S. Thienhaus, M. Wuttig, Z. Y. Zhang, and I. Takeuchi. Combinatorial search of thermoelastic shape-memory alloys with extremely small hysteresis width, Nature Materials, 2006. 5(4): p. 286-290.
29. Li, Y., Q. Guo, J. A. Kalb, and C. V. Thompson. Matching Glass-Forming Ability with the Density of the Amorphous Phase, Science, 2008. 322(5909): p. 1816-1819.
30. Sakurai, J., S. Hata, R. Yamauchi, and A. Shimokohbe. Combinatorial arc plasma deposition search for Ru-based thin film metallic glass, Applied Surface Science, 2007. 254 (3): p. 720-724.
31. Tong, C. J., Y. L. Chen, S. K. Chen, J. W. Yeh, T. T. Shun, C. H. Tsau, S. J. Lin, and S. Y. Chang. Microstructure characterization of AlxCoCrCuFeNi high-entropy alloy system with multiprincipal elements, Metallurgical and Materials Transactions a-Physical Metallurgy and Materials Science, 2005. 36A(4): p. 881-893.
32. Taylor, Andre D., Greg J. Dileo, and Kai Sun, *H2 Production and Performance of Nickel Based Catalysts Synthesized using Supercritical Fluids for the Gasification of Biomass, in Hyforum* 2008 *International Hydrogen Forum.* 2008: Changsha China.
33. Shannon, M. A., P. W. Bohn, M. Elimelech, J. G. Georgiadis, B. J. Marinas, and A. M. Mayes.
Science and technology for water purification in the coming decades, Nature, 2008. 452(7185): p. 301-310.
34. Kang, S., M. S. Mauter, and M. Elimelech. Microbial Cytotoxicity of Carbon-Based Nanomaterials: Implications for River Water and Wastewater Effluent, Environmental Science & Technology, 2009. 43(7): p. 2648-2653.
35. Lee, H., B. P. Lee, and P. B. Messersmith. A reversible wet/dry adhesive inspired by mussels and geckos, Nature, 2007. 448(7151): p. 338-U4.
36. Erlebacher, J., M. J. Aziz, A. Karma, N. Dimitrov, and K. Sieradzki. Evolution of nanoporosity in dealloying, Nature, 2001. 410(6827): p. 450-453.

37. Ding, Y., Y. J. Kim, and J. Erlebacher. Nanoporous gold leaf: "Ancient technology"/advanced material, Advanced Materials, 2004. 16(21): p. 1897-+.

38. Erlebacher, J. and K. Sieradzki. Pattern formation during dealloying, Scripta Materialia, 2003. 49(10): p. 991-996.

39. Strasser, P., S. Koh, T. Anniyev, J. Greeley, K. More, C. F. Yu, Z. C. Liu, S. Kaya, D. Nordlund, H. Ogasawara, M. F. Toney, and A. Nilsson. Lattice-strain control of the activity in dealloyed core-shell fuel cell catalysts, Nature Chemistry, 2010. 2(6): p. 454-460.

40. Conner, R. D., W. L. Johnson, N. E. Paton, and W. D. Nix. Shear bands and cracking of metallic glass plates in bending, Journal of Applied Physics, 2003. 94(2): p. 904-911.

41. Spaepen, F. Microscopic Mechanism for Steady-State Inhomogeneous Flow in Metallic Glasses, Acta Metallurgica, 1977. 25(4): p. 407-415.

42. Lu, J., G. Ravichandran, and W. L. Johnson. Deformation behavior of the $Zr_{41.2}Ti_{13.8}CU_{12.5}Ni_{10}Be_{22.5}$ bulk metallic glass over a wide range of strain-rates and temperatures, Acta Materialia, 2003. 51(12): p. 3429-3443.

43. Inoue, A., W. Zhang, T. Zhang, and K. Kurosaka. High-strength Cu-based bulk glassy alloys in Cu—Zr—Ti and Cu—Hf—Ti ternary systems, Acta Materialia, 2001. 49(14): p. 2645-2652.

44. Long, Z. L., Y. Shao, X. H. Deng, Z. C. Zhang, Y. Jiang, P. Zhang, B. L. Shen, and A. Inoue. Cr effects on magnetic and corrosion properties of Fe—Co—Si—B—Nb—Cr bulk glassy alloys with high glass-forming ability, Intermetallics, 2007. 15(11): p. 1453-1458.

45. Long, Z. L., G. Q. Xie, H. Q. Wei, X. P. Su, J. Peng, P. Zhang, and A. Inoue. On the new criterion to assess the glass-forming ability of metallic alloys, Materials Science and Engineering a-Structural Materials Properties Microstructure and Processing, 2009. 509(1-2): p. 23-30.

46. Vielstich, Wolf, Arnold Lamm, Hubert A. Gasteiger, and Harumi Yokokawa, *Handbook of fuel cells: fundamentals, technology and applications*. 2003, Chichester, England: Wiley. 6 v.

47. Balandin, A. A., *Problems of Chemical Kinetics, Catalysis and Reactivity*. 1955, Moscow: Academy of Sciences.

48. Shao, M. H., P. Liu, J. L. Zhang, and R. Adzic. Origin of enhanced activity in palladium alloy electrocatalysts for oxygen reduction reaction, Journal of Physical Chemistry B, 2007. 111(24): p. 6772-6775.

49. Y., Ishikawa, Liao M. S., and Cabrera C. R., *Computational Materials Science*. Theoretical and Computational Chemistry Series, ed. E. Science. 2004, Amsterdam.

50. Janssen, M. M. P. and J. Moolhuysen. State and Action of Tin Atoms in Platinum-Tin Catalysts for Methanol Fuel-Cells, Journal of Catalysis, 1977. 46(3): p. 289-296.

51. Watanabe, M. and S. Motoo. Electrocatalysis by Ad-Atoms. 1. Enhancement of Oxidation of Methanol on Platinum and Palladium by Gold Ad-Atoms, Journal of Electroanalytical Chemistry, 1975. 60(3): p. 259-266.

52. Watanabe, M. and S. Motoo. Electrocatalysis by Ad-Atoms .2. Enhancement of Oxidation of Methanol on Platinum by Ruthenium Ad-Atoms, Journal of Electroanalytical Chemistry, 1975. 60(3): p. 267-273.

53. Watanabe, M. and S. Motoo. Electrocatalysis by Ad-Atoms.3. Enhancement of Oxidation of Carbon-Monoxide on Platinum by Ruthenium Ad-Atoms, Journal of Electroanalytical Chemistry, 1975. 60(3): p. 275-283.

54. Ruban, A., B. Hammer, P. Stoltze, H. L. Shiver, and J. K. Norskov. Surface electronic structure and reactivity of transition and noble metals, Journal of Molecular Catalysis a-Chemical, 1997. 115(3): p. 421-429.

55. Kitchin, J. R., J. K. Norskov, M. A. Barteau, and J. G. Chen. Role of strain and ligand effects in the modification of the electronic and chemical properties of bimetallic surfaces, Physical Review Letters, 2004. 93(15).

56. Kitchin, J. R., J. K. Norskov, M. A. Barteau, and J. G. Chen. Modification of the surface electronic and chemical properties of Pt(111) by subsurface 3d transition metals, Journal of Chemical Physics, 2004. 120(21): p. 10240-10246.

57. Hammer, B., Y. Morikawa, and J. K. Norskov. CO chemisorption at metal surfaces and overlayers, Physical Review Letters, 1996. 76(12): p. 2141-2144.

58. Greeley, J. and M. Mavrikakis. Near-surface alloys for hydrogen fuel cell applications, Catalysis Today, 2006. 111 (1-2): p. 52-58.

59. Bardi, U., B. C. Beard, and P. N. Ross. Co Chemisorption on the [111] and [100] Oriented Single-Crystal Surfaces of the Alloy Copt3, Journal of Catalysis, 1990. 124(1): p. 22-29.

60. Knudsen, J., A. U. Nilekar, R. T. Vang, J. Schnadt, E. L. Kunkes, J. A. Dumesic, M. Mavrikakis, and F. Besenbacher. A Cu/Pt near-surface alloy for water-gas shift catalysis, Journal of the American Chemical Society, 2007. 129(20): p. 6485-6490.

61. Antolini, E., J. R. C. Salgado, R. M. da Silva, and E. R. Gonzalez. Preparation of carbon supported binary Pt-M alloy catalysts (M=first row transition metals) by low/medium temperature methods, Materials Chemistry and Physics, 2007. 101(2-3): p. 395-403.

62. Ferreira, P. J., G. J. Lao, Y. Shao-Horn, D. Morgan, R. Makharia, S. Kocha, and H. A. Gasteiger. Instability of Pt/C electrocatalysts in proton exchange membrane fuel cells—A mechanistic investigation, Journal of the Electrochemical Society, 2005. 152(11): p. A2256-A2271.

63. Xie, J., D. L. Wood, D. M. Wayne, T. A. Zawodzinski, P. Atanassov, and R. L. Borup. Durability of PEFCs at high humidity conditions, Journal of the Electrochemical Society, 2005. 152(1): p. A104-A113.

64. Zhang, J., K. Sasaki, E. Sutter, and R. R. Adzic. Stabilization of platinum oxygen-reduction electrocatalysts using gold clusters, Science, 2007. 315(5809): p. 220-222.

65. Xu, C. W., H. Wang, P. K. Shen, and S. P. Jiang. Highly ordered Pd nanowire arrays as effective electrocatalysts for ethanol oxidation in direct alcohol fuel cells, Advanced Materials, 2007. 19(23): p. 4256-+.

66. Choi, W. C. and S. I. Woo. Bimetallic Pt-Ru nanowire network for anode material in a directmethanol fuel cell, Journal of Power Sources, 2003. 124(2): p. 420-425.

67. Pan, C. F., H. Wu, C. Wang, B. Wang, L. Zhang, Z. D. Cheng, P. Hu, W. Pan, Z. Y. Zhou, X. Yang, and J. Zhu. Nanowire-based high performance "micro fuel cell": One nanowire, one fuel cell, Advanced Materials, 2008. 20(9): p. 1644-+.

68. Chen, Z. W., M. Waje, W. Z. Li, and Y. S. Yan. Supportless Pt and PtPd nanotubes as electrocatalysts for oxygen-reduction reactions, Angewandte Chemie-International Edition, 2007. 46(22): p. 4060-4063.

69. Gu, X. H., L. Q. Xu, F. Tian, and Y. Ding. Au-Ag Alloy Nanoporous Nanotubes, Nano Research, 2009. 2(5): p. 386-393.

70. Tian, X. K., X. Y. Zhao, L. D. Zhang, C. Yang, Z. B. Pi, and S. X. Zhang. Performance of ethanol electro-oxidation on Ni-Cu alloy nanowires through composition modulation, Nanotechnology, 2008. 19(21).

71. Liu, Lifeng, Eckhard Pippel, Roland Scholz, and Ulrich Gosele. Nanoporous pt-co alloy nanowires: fabrication, characterization, and electrocatalytic properties, Nano Lett, 2009. 9(12): p. 4352-8.

72. Stamenkovic, V. R., B. Fowler, B. S. Mun, G. F. Wang, P. N. Ross, C. A. Lucas, and N. M. Markovic. Improved oxygen reduction activity on Pt3Ni(111) via increased surface site availability, Science, 2007. 315: p. 493-497.

73. Lim, Byungkwon, Majiong Jiang, Pedro H. C. Camargo, Eun Chul Cho, Jing Tao, Xianmao Lu, Yimei Thu, and Younan Xia. Pd-Pt Bimetallic Nanodendrites with High Activity for Oxygen Reduction, Science, 2009. 324(5932): p. 1302-1305.

74. Xia, Y., P. Yang, Y. Sun, Y. Wu, B. Mayers, B. Gates, Y. Yin, F. Kim, and H. Yan. One-Dimensional Nanostructures: Synthesis, Characterization, and Applications, Advanced Materials, 2003. 15(5): p. 353-389.

75. Hu, J. T., T. W. Odom, and C. M. Lieber. Chemistry and physics in one dimension: Synthesis and properties of nanowires and nanotubes, Accounts of Chemical Research, 1999. 32(5): p. 435-445.

76. Schmidt, V. and U. Gosele. How nanowires grow, Science, 2007. 316(5825): p. 698-699.

77. Fasol, G. Applied physics—Nanowires: Small is beautiful, Science, 1998. 280(5363): p. 545-546.

78. Campbell, Andrew, *Professional Engineer, Sales and Marketing Manager, Angstrom Engineering Inc.*, A.D. Taylor, Editor. 2010.

79. Yamauchi, R., S. Hata, J. Sakurai, and A. Shimokohbe. Combinatorial search for low resistivity Pd—Cu—Si thin film metallic glass compositions, Japanese Journal of Applied Physics Part 1-Regular Papers Brief Communications & Review Papers, 2006. 45(7): p. 5911-5919.

80. Taylor, Andre D., Brandon D. Lucas, L. Jay Guo, and Levi T. Thompson. Nanoimprinted electrodes for micro-fuel cell applications, Journal of Power Sources, 2007. 171(1): p. 218-223.

81. Taylor, Andre D. and Levi T. Thompson, *Integrated Micro Fuel Cell Power Supply, in IEEE Solid State Sensors and Actuators Workshop*. 2004: Hilton Head, South Carolina [INCORPORATED BY REFERENCE HEREIN].

82. Hata, S., R. Yamauchi, J. Sakurai, and A. Shimokohbe. Combinatorial arc plasma deposition of thin films, Japanese Journal of Applied Physics Part 1-Regular Papers Brief Communications & Review Papers, 2006. 45(4A): p. 2708-2713.

83. Yamashita, M. and M. Agu. Geometrical Correction Factor For Semiconductor Resistivity Measurements By 4-Point Probe Method, Japanese Journal of Applied Physics Part 1-Regular Papers Short Notes & Review Papers, 1984.23 (11): p. 1499-1504.

84. Dulikravich, G. S., I. N. Egorov, and M. J. Colaco. Optimizing chemistry of bulk metallic glasses for improved thermal stability, Modelling and Simulation in Materials Science and Engineering, 2008. 16(7).

85. Long, Z. L., H. Q. Wei, Y. H. Ding, P. Zhang, G. Q. Xi; and A. Inoue. A new criterion for predicting the glass-forming ability of bulk metallic glasses, Journal of Alloys and Compounds, 2009. 475(1-2): p. 207-219.

86. Kumar, G., D. Rector, R. D. Conner, and J. Schroers. Embrittlement of Zr-based bulk metallic glasses, Acta Materialia, 2009. 57(12): p. 3572-3583.

87. Carmo, Marcelo, Shiyan Ding, Golden Kumar, Jan Schroers, and Andre Taylor, *High Performance Platinum Based Bulk Metallic Glass Nanowires for Micro-Direct Alcohol Fuel Cell Applications, in Solid State Sensors and Actuators Workshop*. 2010: Hilton Head, SC.

88. Goodenough, John B., R. Manoharan, A. K. Shukla, and K. V. Ramesh. Intraalloy electron transfer and catalyst performance: a spectroscopic and electrochemical study, Chemistry of Materials, 1989. 1(4): p. 391-398.

89. Yang, Jinhua, Weijiang Zhou, Chin Hsien Cheng, Jim Yang Lee, and Zhaolin Liu. Pt-Decorated PdFe Nanoparticles as Methanol-Tolerant Oxygen Reduction Electrocatalyst, ACS Applied Materials & Interfaces, 2009. 2(1): p. 119-126.

90. Liu, Fang, Jim Yang Lee, and Wei Jiang Zhou. Segmented Pt/Ru, Pt/Ni, and Pt/RuNi Nanorods as Model Bifunctional Catalysts for Methanol Oxidation, Small, 2006. 2(1): p. 121-128.

91. Mani, P., R. Srivastava, and P. Strasser. Dealloyed Pt-Cu core-shell nanoparticle electrocatalysts for use in PEM fuel cell cathodes, Journal of Physical Chemistry C, 2008. 112(7): p. 2770-2778.

92. Koh, S., N. Hahn, C. F. Yu, and P. Strasser. Effects of Composition and Annealing Conditions on Catalytic Activities of Dealloyed Pt-Cu Nanoparticle Electrocatalysts for PEMFC, Journal of the Electrochemical Society, 2008. 155 (12): p. B1281-B1288.

93. Yang, J., M. Winter, and J. 0. Besenhard. Small particle size multiphase Li-alloy anodes for lithium-ion-batteries, Solid State Ionics, 1996. 90(1-4): p. 281-287.

94. Chan, C. K., H. L. Peng, G. Liu, K. Mcllwrath, X. F. Zhang, R. A. Huggins, and Y. Cui. Highperformance lithium battery anodes using silicon nanowires, Nature Nanotechnology, 2008. 3(1): p. 31-35.

95. Todd, A. D. W., P. P. Ferguson, M. D. Fleischauer, and J. R. Dahn. Tin-based materials as negative electrodes for Li-ion batteries: Combinatorial approaches and mechanical methods, International Journal of Energy Research, 2010. 34(6): p. 535-555.

96. Park, C. M. and H. J. Sohn. Electrochemical Characteristics of TiSb2 and Sb/TiC/C Nanocomposites as Anodes for Rechargeable Li-Ion Batteries, Journal of the Electrochemical Society, 2010. 157(1): p. A46-A49.

97. Kumar, G., H. X. Tang, and J. Schroers. Nanomoulding with amorphous metals, Nature, 2009. 457(7231): p. 868-872.

98. Wilson, M. S. and S. Gottesfeld. High-Performance Catalyzed Membranes of Ultra-Low Pt Loadings for Polymer Electrolyte Fuel-Cells, Journal of the Electrochemical Society, 1992. 139(2): p. L28-L30.

99. Stair, P. C., C. Marshall, G. Xiong, H. Feng, M. J. Pellin, J. W. Elam, L. Curtiss, L. Iton, H. Kung, M. Kung, and H. H. Wang. Novel, uniform nanostructured catalytic membranes, Topics in Catalysis, 2006. 39(3-4): p. 181-186.

100. Hecht, D., L. B. Hu, and G. Gruner. Conductivity scaling with bundle length and diameter in single walled carbon nanotube networks, Applied Physics Letters, 2006. 89.

101. Green, A. A. and M. C. Hersam. Colored semitransparent conductive coatings consisting of monodisperse metallic single-walled carbon nanotubes, Nano Letters, 2008. 8(5): p. 1417-1422.

102. Kim, K. K., J. J. Bae, H. K. Park, S. M. Kim, H. Z. Geng, K. A. Park, H. J. Shin, S. M. Yoon, A. Benayad, J. Y. Choi, and Y. H. Lee. Fermi level engineering of single-walled carbon nanotubes by $AuCl_3$ doping, Journal of the American Chemical Society, 2008. 130(38): p. 12757-12761.

103. Dan, B., G. C. Irvin, and M. Pasquali. Continuous and Scalable Fabrication of Transparent Conducting Carbon Nanotube Films, Acs Nano, 2009. 3(4): p. 835-843.

104. Geng, H. Z., K. K. Kim, K. P. So, Y. S. Lee, Y. Chang, and Y. H. Lee. Effect of acid treatment on carbon nanotube-based flexible transparent conducting films, Journal of the American Chemical Society, 2007. 129(25): p. 7758-+.

105. F. Lupo, J. A. Rodri'guez-Manzo, A. Zamudio, A .L. Elias, Y. A. Kim, T. Hayashi, M. Muramatsu, R. Kamalakaran, H. Terrones, M. Endo, M. Ru"hle, M. Terrones Pyrolytic synthesis of long strands of large diameter single-walled carbon nanotubes at atmospheric pressure in the absence of sulphur and hydrogen, Chemical Physics Letters, 2005. 410: p. 384.

106. F. Villalpando-Paez, A. Zamudio, A. L. Elias, H. Son, E. B. Barros, S. G. Chou, Y. A. Kim, H. Muramatsu, T. Hayashi, J. Kong, H. Terrones, G. Dresselhaus, M. Endo, M. Terrones, M. S. Dresselhaus. Synthesis and characterization of long strands of nitrogen-doped single-walled carbon nanotubes, Chemical Physics Letters, 2006. 424: p. 345.

107. R. Czerw, M. Terrones, J.-C. Charlier, X. Blase, B. Foley, R. Kamalakaran, N. Grobert, H. Terrones, D. Tekleab, P. M. Ajayan, W. Blau, M. Rühle, and D. L. Carroll. Identification of Electron Donor States in N-Doped Carbon Nanotubes, Nano Letters, 2001. 1(9): p. 457.

108. M. Terrones, P. M. Ajayan, F. Banhart, X. Blase, D. L. Carroll, J. C. Charlier, R. Czerw, B. Foley, N. Grobert, R. Kamalakaran, P. Kohler-Redlich, M. Ruble, T. Seeger, H. Terrones. N-doping and coalescence of carbon nanotubes: synthesis and electronic properties, Applied Phyiscs A, 2002. 74: p. .22.

109. Wei, Bingqing; Spolenak, Ralph; Kohler-Redlich, Philipp; Ruhle, Manfred; Arzt, Eduard. Electrical transport in pure and boron-doped carbon nanotubes, Applied Physics Letters, 1999. 74(21).

110. I. C. Gerber, P. Puech, A. Gannouni, W. Bacsa. Influence of Nitrogen doping on the radial breathing mode in carbon nanotues, Physical Review B, 2009. 79: p. 075423.

111. Nessim, G. D., M. Seita, K. P. O'Brien, A. J. Hart, R. K. Bonaparte, R. R. Mitchell, and C. V. Thompson. Low Temperature Synthesis of Vertically Aligned Carbon Nanotubes with Electrical Contact to Metallic Substrates Enabled by Thermal Decomposition of the Carbon Feedstock, Nano Letters, 2009. 9(10): p. 3398-3405.

112. Li, X. S., W. W. Cai, J. H. An, S. Kim, J. Nah, D. X. Yang, R. Piner, A. Velamakanni, I. Jung, E. Tutuc, S. K. Banerjee, L. Colombo, and R. S. Ruoff. Large-Area Synthesis of High-Quality and Uniform Graphene Films on Copper Foils, Science, 2009. 324(5932): p. 1312-1314.

113. Snyder, G. J. and E. S. Toberer. Complex thermoelectric materials, Nature Materials, 2008. 7(2): p. 105-114.

114. Dresselhaus, M. S., G. Chen, M. Y. Tang, R. G. Yang, H. Lee, D. Z. Wang, Z. F. Ren, J. P. Fleurial, and P. Gogna. New directions for low-dimensional thermoelectric materials, Advanced Materials, 2007. 19(8): p. 1043-1053.

115. Rowe, D. M., CRC handbook of thermoelectrics. 1995, Boca Raton, FL: CRC Press. vii, 701.

116. Kim, W., J. Zide, A. Gossard, D. Klenov, S. Stemmer, A. Shakouri, and A. Majumdar. Thermal conductivity reduction and thermoelectric figure of merit increase by embedding nanoparticles in crystalline semiconductors, Physical Review Letters, 2006. 96(4).

117. Cava, R. J. Structural Chemistry and the Local Charge Picture of Copper-Oxide Superconductors, Science, 1990. 247(4943): p. 656-662.

118. Wang, Y. B., H. F. Li, Y. F. Zheng, S. C. Wei, and M. Li. Correlation between corrosion performance and surface wettability in ZrTiCuNiBe bulk metallic glasses, Applied Physics Letters, 2010. 96(25).

119. Nie, Z. H. and E. Kumacheva. Patterning surfaces with functional polymers, Nature Materials, 2008. 7(4): p. 277-290.

The invention claimed is:

1. A method for providing electrocatalytic functionality to a system, comprising:
   a. providing one or more bulk metallic glass elements to the system, wherein at least one of the one or more bulk metallic glass elements comprises a geometry or shape that provides effective electrocatalytic performance to the system, and wherein the at least one of the one or more bulk metallic glass elements is a Pt-BMG.

2. A method according to claim 1, wherein the at least one bulk metallic glass element includes one or more nanowires.

3. A method according to claim 2, wherein the one or more nanowires have a diameter of less than 15 nanometers.

4. A method according to claim 1, wherein the Pt-BMG is at least in part Pt58Cu15Ni5P22.

5. A method according to claim 1, wherein the at least one bulk metallic glass element is palladium-based.

6. A method according to claim 1, wherein the at least one bulk metallic glass element comprises an aspect ratio that provides enhanced electrocatalytic performance relative to conventional electrocatalytic assemblies.

7. A method according to claim 1, wherein the at least one bulk metallic glass element is provided to an energy application system.

8. A method according to claim 7, wherein the energy application system is selected from the group consisting of a fuel cell, a battery and a solar cell.

9. A method according to claim 1, further comprising selecting one or more bulk metallic glass elements based upon electrocatalytic effectiveness.

10. A method according to claim 9, wherein the method for selection includes synthesis of a combinatorial, multi-component library of selectd materials deposited as a sample array and high throughput characterization methods utilizing spectrometric measurements and diffractive imaging to establish a phase state distribution with respect to the selected materials included in the combinatorial library.

11. A method according to claim 1, further comprising fabricating nanowires from the at least one bulk metallic glass element by a fabrication method that includes: (i) providing an anodized aluminum oxide template; (ii) combining the at least one bulk metallic glass element with the template; (iii) heating and pressurizing the at least one bulk metallic glass element and template to a super cooled liquid region; (iv) allowing the at least one bulk metallic element to fill pores defined in the template; and (v) dissolving the template to isolate nanowires formed from the at least one bulk metallic element.

12. A method according to claim 10, wherein the sample array is formed as a thin film.

13. A method according to claim 10, wherein the spectrometric measurements are generated utilizing an energy-dispersive X-ray fluorescence spectrometer.

14. A method according to claim 10, wherein the diffractive imaging utilizes an imaging-plate X-ray diffractometer.

* * * * *